US010763438B2

(12) United States Patent
Chua et al.

(10) Patent No.: US 10,763,438 B2
(45) Date of Patent: Sep. 1, 2020

(54) N-DOPED ELECTRICALLY CONDUCTIVE POLYMERIC MATERIAL

(71) Applicant: National University of Singapore, Singapore (SG)

(72) Inventors: Lay-Lay Chua, Singapore (SG); Peter Kian-Hoon Ho, Singapore (SG); Rui-Qi Png, Singapore (SG); Mervin Chun-Yi Ang, Singapore (SG); Kim-Kian Choo, Singapore (SG); Cindy Guan-Yu Tang, Singapore (SG)

(73) Assignee: National University of Singapore, Singapore (SG)

( * ) Notice: Subject to any disclaimer, the term of this patent is extended or adjusted under 35 U.S.C. 154(b) by 275 days.

(21) Appl. No.: 15/738,007

(22) PCT Filed: Jul. 1, 2016

(86) PCT No.: PCT/SG2016/050310
§ 371 (c)(1),
(2) Date: Dec. 19, 2017

(87) PCT Pub. No.: WO2017/003382
PCT Pub. Date: Jan. 5, 2017

(65) Prior Publication Data
US 2018/0277764 A1  Sep. 27, 2018

(30) Foreign Application Priority Data

Jul. 1, 2015 (SG) .......................... 10201505234R

(51) Int. Cl.
*H01L 51/00* (2006.01)
*C08G 61/12* (2006.01)
(Continued)

(52) U.S. Cl.
CPC .......... *H01L 51/0036* (2013.01); *C08G 61/02* (2013.01); *C08G 61/123* (2013.01);
(Continued)

(58) Field of Classification Search
CPC ....................... H01L 51/0036; H01L 51/0043
(Continued)

(56) References Cited

U.S. PATENT DOCUMENTS 7,807,687 B2 * 10/2010 Salbeck ............... C07D 215/24
514/267
2008/0015269 A1   1/2008 Bazan et al.
(Continued)

FOREIGN PATENT DOCUMENTS

WO    WO2015082879 A1    6/2015

OTHER PUBLICATIONS

Sivaramakrishnan, S., et. al.; Solution-processed conjugated polymer organic p-i-n light-emitting diodes with high built-in potential by solution- and solid-state doping; Applied Physics Letters Physics Letters, 2009, vol. 95, pp. 213303-1-213303-3, Nov. 2009.
(Continued)

*Primary Examiner* — Tahseen Khan

(57) ABSTRACT

There is provided a material comprising a n-doped electrically conductive polymer comprising at least one electron-deficient aromatic moiety, each electron-deficient aromatic moiety having a gas-phase electron affinity ($E_A$) of 1-3 eV; and at least one counter-cation covalently bonded to the polymer or to a further polymer comprised in the material, the polymer being n-doped to a charge density of 0.1-1 electron per electron-deficient aromatic moiety, the polymer being capable of forming a layer having a vacuum workfunction (WF) of 2.5-4.5 eV, and wherein all the counter-cations comprised in the material are immobilised such that any electron in the polymer cannot significantly diffuse or
(Continued)

migrate out of the polymer. There is also provided a method of preparing the material.

18 Claims, 11 Drawing Sheets

(51) Int. Cl.
| | | |
|---|---|---|
| *C08G 61/02* | (2006.01) | |
| *C08L 65/00* | (2006.01) | |
| *H01B 1/12* | (2006.01) | |
| *H01L 51/05* | (2006.01) | |
| *H01L 51/50* | (2006.01) | |
| *H01L 51/10* | (2006.01) | |
| *H01L 51/42* | (2006.01) | |

(52) U.S. Cl.
CPC .......... *C08G 61/126* (2013.01); *C08L 65/00* (2013.01); *H01B 1/127* (2013.01); *H01L 51/0035* (2013.01); *H01L 51/0039* (2013.01); *H01L 51/0043* (2013.01); *C08G 2261/124* (2013.01); *C08G 2261/143* (2013.01); *C08G 2261/149* (2013.01); *C08G 2261/1412* (2013.01); *C08G 2261/18* (2013.01); *C08G 2261/228* (2013.01); *C08G 2261/3142* (2013.01); *C08G 2261/3223* (2013.01); *C08G 2261/3241* (2013.01); *C08G 2261/3243* (2013.01); *C08G 2261/3246* (2013.01); *C08G 2261/344* (2013.01); *C08G 2261/411* (2013.01); *C08G 2261/414* (2013.01); *C08G 2261/514* (2013.01); *C08G 2261/72* (2013.01); *C08G 2261/792* (2013.01); *C08G 2261/91* (2013.01); *C08G 2261/92* (2013.01); *C08G 2261/94* (2013.01); *C08G 2261/95* (2013.01); *H01L 51/0069* (2013.01); *H01L 51/0562* (2013.01); *H01L 51/0575* (2013.01); *H01L 51/105* (2013.01); *H01L 51/42* (2013.01); *H01L 51/5092* (2013.01)

(58) Field of Classification Search
USPC .......................................................... 428/220
See application file for complete search history.

(56) References Cited

U.S. PATENT DOCUMENTS

| | | | | |
|---|---|---|---|---|
| 2008/0265751 | A1* | 10/2008 | Smith | H01L 51/5206 313/504 |
| 2009/0004402 | A1* | 1/2009 | Ho | C07C 247/16 427/510 |
| 2012/0130025 | A1 | 5/2012 | Swager et al. | |
| 2013/0134402 | A1* | 5/2013 | Tanaka | H01L 51/5004 257/40 |
| 2013/0210828 | A1* | 8/2013 | Whitten | C07C 309/11 514/249 |

OTHER PUBLICATIONS

Voortman, T.P., et. al.; Stabilizing cations in the backbones of conjugated polymers; J. Mater. Chem. C., 2014, pp. 3407-3415, published Jan. 16, 2014.
Zotti, G. et. al., New Highly Conjugated Polycationic Polythiophenes from Anodic Coupling of (4H-Cyclopentadithien-4-yl)alkylammonium Salts, Macromolecules, 2001, 34 (12), pp. 3889-3895, published May 5, 2001.
PCT International Search Report, PCT/SG2016/050310, dated Jul. 29, 2016.
Written Opinion of the International Search Authority, PCT/SG2016/050310, dated Jul. 29, 2016.

* cited by examiner

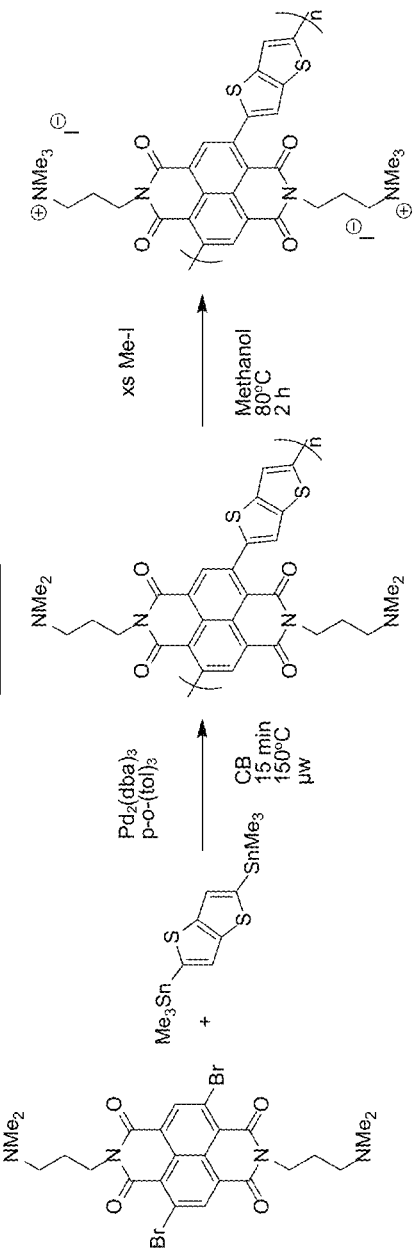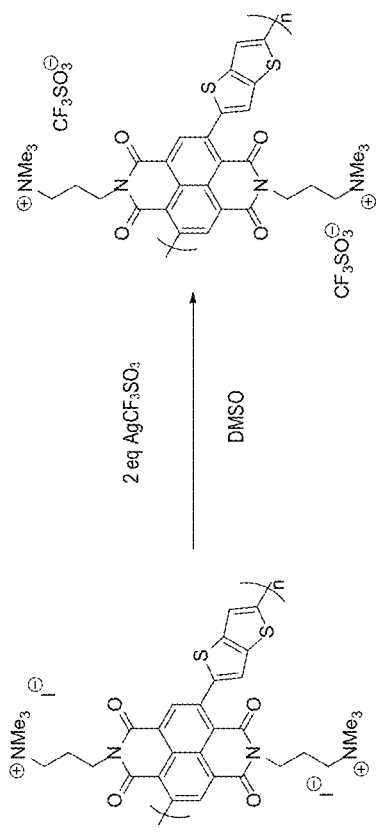

N-DOPED ELECTRICALLY CONDUCTIVE POLYMERIC MATERIAL

This application claims priority to PCT/SG2016/050310 filed on Jul. 1, 2016, which in turn claims priority to application serial no. SG 10201505234R filed in Singapore on Jul. 1, 2015, the disclosures of which are incorporated herein by reference in their entirety.

TECHNICAL FIELD

The present invention relates to a n-doped electrically conductive polymeric material, a method of making the same and its uses thereof.

BACKGROUND n-Doped electrically-conductive polymers are π-conjugated polymer organic semiconductors (OSCs) that have been n-doped to an electrically-conductive state. This can be achieved using an n-dopant, which is a strong reductant or electron donor, introduce electrons into the π-conjugated system of the polymer backbone. The electrons are mobile and can therefore carry current. As the polymer backbone becomes negatively-charged, it needs to be counterbalanced by cations called counter-cations. Although molecular OSCs can be n-doped, n-doped polymer OSCs have particular advantages related to solution and film processing to give electron-injection layers (EILs) and electron-extraction layers (EELs).

n-Doped polymer OSCs are useful as electron contacts of semiconductor devices to perform the function of electron injection into semiconductors for various device applications, and of electron extraction in solar-cell and photovoltaic applications. The layers performing these functions are called EILs and EELs, respectively. A suitable electrical conductivity for applications as EILs and EELs in semiconductor devices is between $10^{-6}$ to $10^2$ S cm$^{-1}$. In practice, however, the n-doped polymer OSCs that have been achieved so far are unstable. As a result, n-doped electrically-conductive polymers are not available for EIL and EEL application development even on a research scale. The key challenges are poor chemical, thermal and processing instability of negatively-charged π-conjugated systems, restricted thermodynamic window of stability for n-doped polymers in ambient, and general difficulty to form films with stable doping profiles (i.e., the dependence of doping level with distance across the layer thickness) that do not change deleteriously with processing.

Besides electrical conductivity, the workfunction (WF) of the EIL and EEL also plays a role in determining its effectiveness as an electron contact for electron injection and extraction. When the EIL or EEL is applied in a device, what matters is the effective workfunction (WF$_{eff}$) of the EIL (EEL) at its buried contact with the adjacent semiconductor inside the device. The energy difference between the WF$_{eff}$ of the EIL and the electron affinity (E$_A$) of the semiconductor gives the apparent thermodynamic barrier for electron injection (Δe) from the EIL into the semiconductor. However, this WF$_{eff}$ is related to the vacuum WF which is a property of the EIL or EEL film.

Polymer OSCs can be n-doped by evaporation of low-workfunction metals, for example the alkali metals (Li, Na, K, Rb and Cs) and alkaline-earth metals (in particular Ca and Ba) and some transition metals (Sm) onto their surfaces. The resultant n-doping of the polymer surface is confirmed by changes in the density-of-states of the polymer OSC which can be measured by ultraviolet photoemission spectroscopy, and also validated through the greatly improved electron-injection currents observed in diodes (see for example, U.S. Pat. No. 8,049,408). This introduces the corresponding metal cation as the counter-cation. However, the doping only occurs at the surface. Furthermore, these are not generally stable against dedoping for manipulation into devices, nor against migration of the doping profile, i.e. doped carrier density as a function of distance, which frustrates the development of a general solution-based approach for ohmic contacts employing doped polymers. Alternative approach employing metal oxides has limitations including the need for vacuum deposition and/or high temperature post-annealing which may not be desirable.

n-Doped polymers are different from "n-type" polymers. Examples of n-type polymers include insulating and semiconducting polymers such as: polyethylenimine ethoxylated (PEIE) and polyethylenimine (PEI) that are deposited onto transparent conducting oxides and p-doped conducting polymers such as poly(3,4-ethylenedioxythiophene): poly(styrene sulfonic acid) to give low WF surfaces; and undoped conjugated polyelectrolytes. However these do not have well-defined bulk WF, are highly resistive and cannot generally give ohmic electron contacts to semiconductors.

n-Doped polymers may also be made by self-n-doping using hydroxide or iodide as dopant. However, this self-n-doping is generally not able to provide a doping level of more than 0.1 electron per electron-deficient moiety and a WF shallower than 4.0 eV needed to achieve effective EIL (EEL) materials.

There is therefore a need for an improved material capable for use as EIL or EEL.

SUMMARY OF THE INVENTION

The present invention seeks to address these problems, and/or to provide an improved material which is suitable for forming ohmic electron contacts to any desired OSC for various applications.

In general terms, the invention relates to a n-doped polymeric material which gives suitable electrical conductivity, workfunction and processing characteristics with sufficient chemical, thermal and processing stability to form useful EILs and EELs with appropriate WF$_{eff}$ and stable n-doped profiles for electron injection into any desired OSC with E$_A$ down to the WF of the layer.

According to a first aspect, the present invention provides a material comprising:
  a n-doped electrically conductive polymer comprising at least one electron-deficient aromatic moiety, each electron-deficient aromatic moiety having a gas-phase electron affinity (E$_A$) of 1-3 eV; and
  at least one counter-cation covalently bonded to the polymer or to a further polymer comprised in the material,
wherein the polymer is n-doped to a charge density of 0.1-1 electron per electron-deficient aromatic moiety, the polymer is capable of forming a layer having a vacuum workfunction (WF) of 2.5-4.5 eV, and wherein all the counter-cations comprised in the material may be immobilised such that any electron in the polymer cannot significantly diffuse or migrate out of the polymer.

The polymer may be any suitable polymer for the purposes of the present invention. According to another particular aspect, the polymer may be fully-conjugated or partially-conjugated. The polymer may comprise optionally at least one co-moiety selected from the group consisting of, but not limited to, substituted or unsubstituted: fluorene, phenylene, arylene vinylene, thiophene, azole, quinoxaline, thienothiophene, arylamine, bisphenol-A, methacrylate, siloxane, meta-linked benzene, and a combination thereof.

The electron-deficient aromatic moiety may be a part of the polymer backbone or may be present as a pendant unit attached to a polymer backbone. The $E_A$ of the electron-deficient aromatic moiety may be 1-3 eV, 1.2-2.8 eV, 1.5-2.5 eV, 1.8-2.2 eV, 2.0-2.1 eV. In particular, the $E_A$ may be 1.5-2.5 eV.

The electron-deficient aromatic moiety may be any suitable moiety for the purposes of the present invention. For example, the electron-deficient aromatic moiety may be, but not limited to, a functionalized polycyclic aromatic motif, monoannulated benzo motif, bisannulated benzo motif, monoannulated naphtho motif, bisannulated naphtho motif, monoannulated heterocylic motif, pyridine motif, benzene motif, pyrylium motif, or a combination thereof.

In particular, the electron-deficient aromatic moiety may be, but not limited to, substituted or unsubstituted: benzothiadiazole, benzobisthiadiazole benzooxadiazole, benzobisoxadiazole, benzimidazole, indazole, benzotriazole perylenetetracarboxydiimide, napthalenetetracarboxydiimide, diketopyrrolopyrrole, thienopyrrole, thiadiazoloquinoxaline, napthothiadiazole, napthobisthiadiazole, indenoflurene, 2,5-difluorobenzene, fluorene, or a combination thereof.

According to a particular aspect, at least one hydrogen on an aromatic ring of the electron-deficient aromatic moiety may be substituted with a group comprising, but not limited to: alkyl, cycloalkyl, phenyl, substituted phenyl, substituted heterocyclic, alkoxy, phenoxy, substituted phenoxy, alkylthio, phenylthio, substituted phenylthio, fluorine, cyano, nitro, alkylketo, trichloromethyl, or trifluoromethyl.

The at least one counter-cation covalently bonded to the polymer or to a further polymer comprised in the material may be any suitable counter-cation for the purposes of the present invention. For example, the counter-cation may be a hydrophobic, non-electrophilic and/or weakly electrophilic cation and have good reductive stability. According to a particular aspect, the counter-cation may be, but not limited to, substituted or unsubstituted ammonium, morpholinium, piperidinium, pyrrolidinium, sulfonium, phosphonium, pyridinium, imidazolium, pyrrolium and pyrylium.

According to a particular aspect, the material may comprise at least, but not limited to:
poly(2,5-bis(3-trimethylammoniopropyl-3-(5-(thieno[3,2-b]thiophen-2,5-yl)thiophen-2-yl)-6-(thiophen-2,5-yl)pyrrolo[3,4-c]pyrrole-1,4(2H,5H)-dione)triflate] (DPPT2C3NMe3OTf-TT);
poly{[N,N'-bis(3-trimethylammoniopropyl)-naphthalene-1,4,5,8-bis(dicarboximide)-2,6-diyl]-alt-[2,5-(thieno[3,2-b]thiophene)]iodide} (NDIC3NMe3I-TT);
poly{[N,N'-bis(3-trimethylammoniopropyl)-naphthalene-1,4,5,8-bis(dicarboximide)-2,6-diyl]-alt-[2,5-(thieno[3,2-b]thiophene)]triflate} (NDIC3NMe3OTf-TT);
poly{[N,N'-bis(3-(4-methylmorpholino)propyl)-naphthalene-1,4,5,8-bis(dicarboximide)-2,6-diyl]-alt-[2,5-(thieno[3,2-b]thiophene)]triflate} (NDIC3MorOTf-TT);
poly{[N,N'-bis(3-trimethylammoniopropyl)-naphthalene-1,4,5,8-bis(dicarboximide)-2,6-diyl]-alt-[5,5'-(2,2'-bithiophene)triflate}, (NDIC3NMe3OTf-T2);
poly{[9,9'-bis(3-trimethylammoniopropyl)fluorenyl-2,7-diyl]-alt-(benzo[2,1,3]thiadiazole-4,8-diyl)triflate} (BT-F3NMe3OTf); or
poly{[9,9'-bis(3-trimethylammoniopropyl)fluorenyl-2,7-diyl]-alt-(9,9'-dioctylfluorenyl-2,7-diyl)} (F3NMe3OTf-F8).

According to a second aspect, the present invention provides a composition comprising the material according to the first aspect and a polymer diluent. The polymer diluent may be any suitable polymer diluent for the purposes of the present invention.

According to a third aspect, there is provided a method of preparing a material according to the first aspect, the method comprising:
preparing a mixture comprising a polymer and at least one counter-cation covalently bonded to the polymer or to a further polymer, the polymer comprising: at least one electron-deficient aromatic moiety, each electron-deficient aromatic moiety having a gas-phase electron affinity ($E_A$) of 1-3 eV;
doping the polymer with a n-dopant to form a n-doped polymer, wherein the n-dopant is a reductant with a formal reduction potential smaller than about −1.3 V versus a Standard Hydrogen Electrode; and
removing excess mobile counter-cations to form the material.

The polymer, counter-cation and electron-deficient aromatic moiety may be as described above in relation to the first aspect.

The n-dopant may be any suitable n-dopant for the purposes of the present invention. For example, the n-dopant may be a electron-transfer reductant. In particular, the n-dopant may be a one-electron reductant. According to a particular aspect, the n-dopant may be, but not limited to, sodium, sodium napthalenide, sodium benzophenone keyl ($NaPh_2CO$), sodium 9,10-diphenylanthracenide (NaDPA), cobaltocene (CoCp2) or decamethylcobaltocene (CoCp*2). According to another aspect, the n-dopant may be generated from a precursor n-dopant by light or heat activation, and selected from the group consisting of derivatives of: 2-phenyl-1,3-dialkyl-2,3-dihydrobenzimidazole, 2-phenyl-1,2,3-trialkyl-2,3-dihydrobenzimidazole and 1,2,2,3-tetraalkyl-2,3-dihydrobenzimidazole.

According to a particular aspect, the removing may comprise contacting the n-doped polymer with a solvent. The solvent may be any suitable solvent for the purposes of the present invention. In particular, the solvent may have a formal reduction potential smaller than about −2 V versus a Standard Hydrogen Electrode and a dielectric constant>20.

According to a particular aspect, the method may further comprise depositing a layer of the polymer on a surface of a substrate prior to the doping. The substrate may be any suitable substrate for the purposes of the present invention. The method may further comprise patterning the layer prior to the doping following the depositing. The depositing and patterning may be by any suitable method for the purposes of the present invention.

According to a fourth aspect, there is provided a layer comprising the material of the first aspect. In particular, the layer may have a vacuum workfunction (WF) of 2.5-4.5 eV.

The layer may be in any suitable form. For example, the layer may be in the form of a film. According to a particular aspect, the layer may be an electron-injection layer (EIL) or an electron-extraction layer (EEL). In particular, the layer may form an ohmic electron-injection or electron-extraction contact to a semiconductor.

The layer may have a thickness suitable for the purposes of the present invention. For example, the thickness of the layer may be 5-100 nm. In particular, the thickness of the layer may be 10-95 nm, 15-90 nm, 20-85 nm, 25-80 nm, 30-75 nm, 35-70 nm, 40-65 nm, 45-60 nm, 50-55 nm.

According to a fifth aspect, the present invention provides a device comprising the material according to the first aspect or a layer according to the fourth aspect. The device may be an organic semiconductor device.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings.

DETAILED DESCRIPTION

Figure 1C:
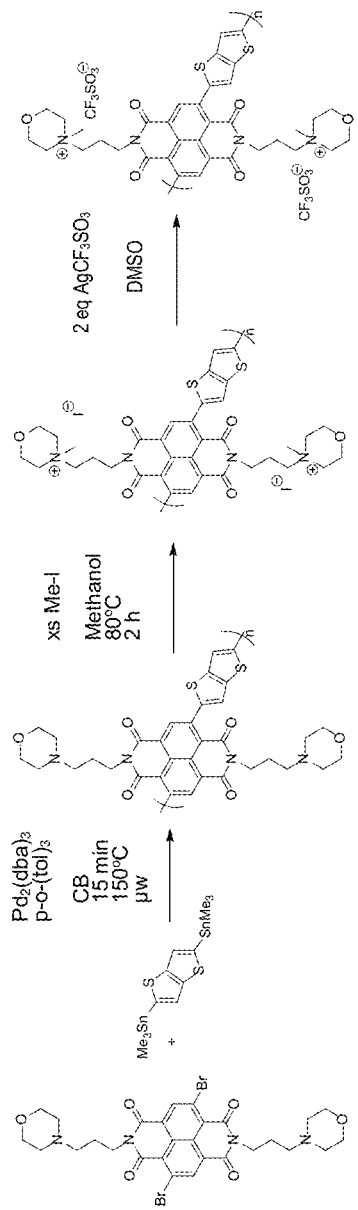
FIG. 1 shows synthesis routes of various materials according to embodiments of the present invention.

It is important to form ohmic electron contact to any desired organic semiconductor (OSC) for various applications. There is therefore a need to provide for a solution-processable electron-injection layer (EIL) and electron-extraction layer (EEL) approach based on n-doped or n-dopable polymer OSCs to form ohmic electron contacts to any desired OSC for various applications.

The present invention provides a general structure for n-doped polymer OSCs that have enhanced chemical, thermal and processing stability. In particular, the n-doped polymeric material may have a heavily n-doped state with up to tens of % of an electron per polymer repeat unit, a method to incorporate these materials into devices to obtain EILs and EELs with appropriate $WF_{eff}$ and stable n-doped profiles for electron injection into the desired OSC. For example, for this to occur, the WF of the EIL and EEL material needs to match the $E_A$ of the semiconductor.

In particular, the n-doped polymeric material comprise electron-deficient aromatic moieties, and covalently-attached counter-cations, and optionally further comprising one or more non-covalently attached spectator anions, and their undoped precursors, that can give the desired electrical conductivity, workfunction, and processing characteristics, with sufficient chemical, thermal and processing stability to form useful EILs and EELs with an appropriate vacuum WF to give the desired $WF_{eff}$ and stable n-doped profiles for electron injection into the desired OSC. These materials may therefore provide near ohmic electron contacts, both injection and extraction, to semiconductor materials including OSCs. The semiconductors may be organic materials, or inorganic materials including quantum dots, nanowires, fullerenes, carbon nanotubes, graphenes, 2D materials and soft inorganic crystals such as perovskites The vacuum workfunction (WF) of the EIL and EEL is expected to play a role in determining its effectiveness as the electron contact for electron injection and extraction. The vacuum WF is the difference in energy between the Fermi level ($E_F$) of the conductive material and the vacuum level ($E_{vac}$). Therefore, $$WF = E_{vac} - E_F.$$

When the EIL or EEL is applied in a device, what matters is the effective WF ($WF_{eff}$) of the EIL or EEL at its buried contact with the adjacent semiconductor inside the device. The $WF_{eff}$ is the difference in energy between the $E_F$ of the conductive material and the $E_{vac}$ associated with the semiconductor in the device. Therefore, $$WF_{eff} = E_{vac}(\text{semicond}) - E_F.$$

The $WF_{eff}$ of the buried contact of a semiconductor device can be obtained from built-in potential measurements, for example by electroabsorption spectroscopy, as described in: M. Zhou et al, Appl. Phys. Lett., 2012, 101:013501, and also from low-temperature open-circuit voltage measurements under photo-illumination, as described in: B. Liu et al, Adv. Energy Mater., 2014, 4:1200972.

The energy difference between the $WF_{eff}$ of the EIL and the electron affinity ($E_A$) of the semiconductor gives the apparent thermodynamic barrier for electron injection Δe from the EIL into the semiconductor:

$$\Delta e = WF_{eff} - E_A.$$

The $E_A$ of the semiconductor is the energy of the conduction band edge of the semiconductor below the vacuum level. The conduction band edge corresponds to the edge of the lowest-unoccupied-molecular-orbital (LUMO) band. For some purposes, the gas-phase $E_A$ may be an even more useful quantity which can be computed for all materials in an unambiguous way. The gas-phase $E_A$ is the $E_A$ of the material in the gas phase. This quantity can be obtained by high-quality quantum chemical calculations including density functional theory (DFT) calculations. Unless otherwise specified, $E_A$ refers to the solid-state quantity. The $E_A$ of the semiconductor is typically higher than the corresponding gas phase $E_A$ by roughly 1.5 eV due to polarization effects (M. Pope, C. E. Swenberg, Electronic Processes in Organic Crystals and Polymers (Oxford University Press, 1999)).

The preferred EIL or EEL contacts are obtained when Δe is pinned by electron transfer to the semiconductor. Therefore, the vacuum WF of the EIL or EEL typically needs to approach close to 0.2 eV of the $E_A$ of the semiconductor. Numerous OSCs of practical technological interest have $E_A$ smaller than 4.3 eV.

For polymer organic light-emitting diodes (OLEDs), most of the light-emitting OSCs have $E_A$ within the range of 2.5-3.8 eV. For organic field-effect transistors (OFETs), most of the recent air-stable n-type semiconductors of interest, such as PNDI(2OD)-T2, have $E_A$ within the range of 3.5-4.3 eV. The usual gold contacts do not provide n-type ohmic characteristics for these materials. For organic solar cells, the new photoactive materials developed also often have $E_A$ of the acceptors within the range of 3.5-4.3 eV. The lack of suitable n-doped EILs and EELs with the required electrical conductivity, WF and processability to make suitable electron contacts to these semiconductor layers is the key reason why device performance and device design flexibility are still limited.

According to a first aspect, the present invention provides a material comprising:
 a n-doped electrically conductive polymer comprising at least one electron-deficient aromatic moiety, each electron-deficient aromatic moiety having a gas-phase electron affinity ($E_A$) of 1-3 eV; and
 at least one counter-cation covalently bonded to the polymer or to a further polymer comprised in the material,
wherein the polymer is n-doped to a charge density of 0.1-1 electron per electron-deficient aromatic moiety, the polymer is capable of forming a layer having a vacuum workfunction ($WF_{eff}$) of 2.5-4.5 eV, and wherein all the counter-cations comprised in the material may be immobilised such that any electron in the polymer cannot significantly diffuse or migrate out of the polymer.

According to a particular aspect, the immobilisation of the counter-cations preventing the diffusion or migration within the polymer may be by the covalent bonding of the cation to the polymer or the further polymer.

In particular, the vacuum WF may be 2.5-4.3 eV, 2.8-4.0 eV, 3.0-3.8 eV, 3.2-3.6 eV, 3.4-3.5 eV. Even more in particular, the $WF_{eff}$ may be 2.5-4.0 eV. The WF may depend on the semiconductor on which the material is used.

In particular, the charge density to which the polymer is doped may be 0.1-0.9, 0.2-0.8, 0.3-0.7, 0.4-0.6, 0.45-0.5 electron per electron-deficient aromatic moiety.

For the purposes of the present invention, the term polymer will be taken to comprise polymers and/or oligomers. Polymers are macromolecules of relatively high molecular weights of more than 5 kDa, with typically more than ten identical or dissimilar monomer (repeat) units bonded together. Oligomers are macromolecules of relatively low molecular weights of 5 kDa or less, with typically at least two and up to ten identical or dissimilar monomer (repeat) units bonded together. Polymers and oligomers share several key processing advantages, including solvent processability and film formability, and may therefore be considered as a class.

The polymer may be any suitable polymer for the purposes of the present invention. The polymer may optionally comprise at least one co-moiety selected from the group consisting of, but not limited to, substituted or unsubstituted: fluorene, phenylene, arylene vinylene, thiophene, azole, quinoxaline, thienothiophene, arylamine, bisphenol-A, methacrylate, siloxane and meta-linked benzene.

The at least one electron-deficient aromatic moiety may be any suitable electron-deficient aromatic moiety for the purposes of the present invention. For example, the electron-deficient aromatic moiety may be part of the polymer backbone or may be present as a pendant unit attached to a polymer backbone.

The electron-deficient aromatic moieties for the purposes of the present invention may be defined as a moiety comprising an aromatic cycle and/or heterocycle with gas-phase $E_A$ larger than 1 eV to provide the desired WF in the n-doped polymer that provides a best mix of properties to the EIL and EEL such as processability, stability and minimum Δe. In particular, the $E_A$ of the electron-deficient aromatic moiety may be 1-3 eV, 1.2-2.8 eV, 1.5-2.5 eV, 1.8-2.2 eV, 2.0-2.1 eV. In particular, the $E_A$ may be 1.5-2.5 eV.

The gas-phase $E_A$ of the electron-deficient aromatic moiety may be closely related to the gas-phase $E_A$ of the polymer OSC in which the electron-deficient moiety occurs as part of the polymer backbone or as a pendant group. The gas-phase $E_A$ of the polymer OSC may in turn be related to the $E_A$ of its film by the polarization energy of the negative charge. This may be related to the vacuum $W_F$ of the film, which may be related to its effective $W_F$ in contact with the semiconductor which determines Δe in an OSC device.

The gas-phase $E_A$ values of the aromatic moieties can obtained from any known methods. For example, $E_A$ values of the aromatic moieties may be obtained from the electron-attachment spectroscopies (H. P. Fenzlaff and E. Illenberger, Int. J. Mass Spectr. Ion Processes, 1984, 59:185). The $E_A$ values of the aromatic moieties may also be obtained from high-quality quantum chemical calculations, which may provide fast unambigous screening of possible chemical structures. An example of such calculations is density functional theory (DFT) using a suitable hybrid functional such as CAM-B3LYP (T. Yanai, D. Tew and N. Handy, Chem. Phys. Lett., 2004, 393:51) with a suitably large basis set such as 6-31+G* to take care of the diffuse portion of the orbital in which the mobile electron resides (A. Modelli et al, J. Phys. Chem. A, 2006, 110:6482).

If the electron-deficient aromatic moiety is π-conjugated with other units in the polymer backbone, π-conjugated interactions will shift (increase) the gas-phase $E_A$ of the polymer OSC. However if these other units are much less electron-deficient, as is often the case, or if the electron-deficient aromatic moiety is not conjugated to other π-electron systems, the electron-deficient aromatic moiety will in effect set the gas-phase $E_A$ of the polymer OSC. Therefore, the gas-phase $E_A$ of the electron-deficient moiety may provide a first important screening parameter. Decreasing $E_A$ will therefore tend to make $WF_{eff}$ of the material shallower, while increasing $E_A$ will tend to make $WF_{eff}$ of the material deeper.

According to a particular aspect, the electron-deficient aromatic moiety may be, but not limited to, a functionalized polycyclic aromatic motif, monoannulated benzo motif, bisannulated benzo motif, monoannulated naphtho motif, bisannulated naphtho motif, monoannulated heterocylic motif, pyridine motif, benzene motif, pyrylium motif, or a combination thereof.

Examples of the electron-deficient aromatic moiety are provided below:

(a) Functionalized Polycyclic Aromatic Motifs:

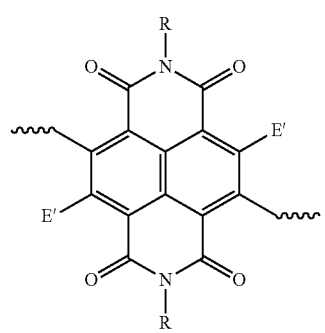

-continued

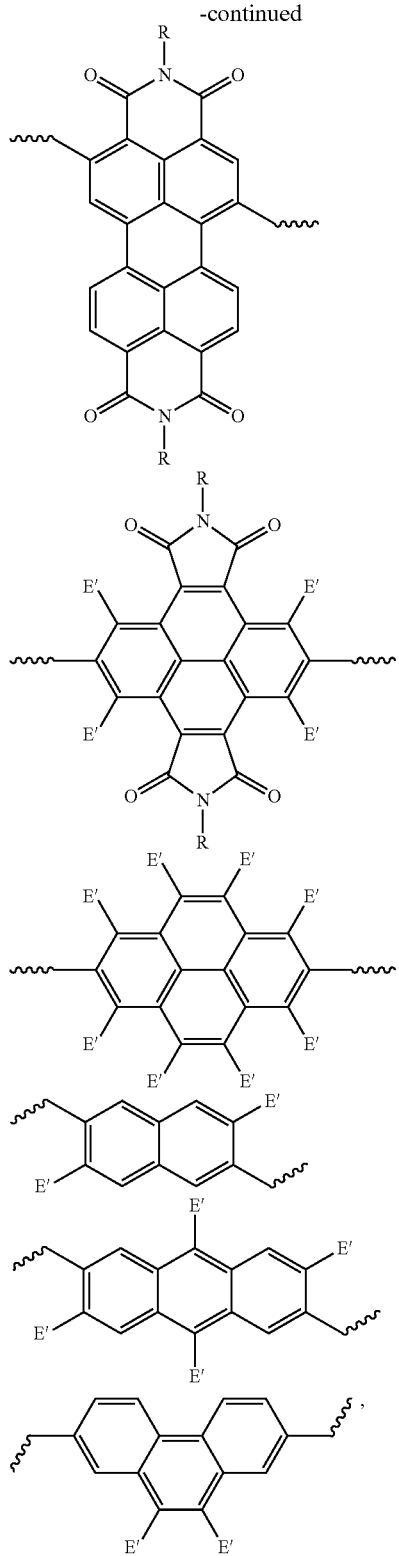

wherein
R=alkyl, cycloalkyl, phenyl, substituted phenyl groups, substituted heterocyclic groups, alkoxy, phenoxy or substituted phenoxy groups, optionally functionalized with cation groups;
E'=H, F, CF$_3$, CN, NO$_2$, NMe$_3^+$; and
wavy line denotes connection to polymer or to R.

(b) Monoannulated Benzo Motifs:

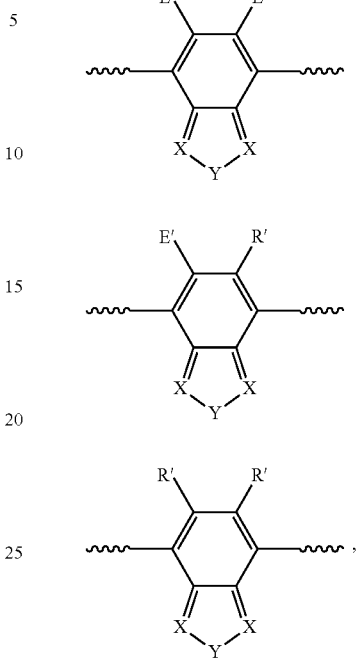

wherein
X=N;
Y=S, Se, O, N(R), S=O, S(=O)$_2$;
E'=H, F, CF$_3$, CN, NO$_2$, NMe$_3^+$;
R=alkyl, cycloalkyl, phenyl, substituted phenyl groups, substituted heterocyclic groups, alkoxy, phenoxy or substituted phenoxy groups, optionally functionalized with cation groups;
R'=H, alkyl, cycloalkyl, phenyl, substituted phenyl groups, substituted heterocyclic groups, alkoxy, phenoxy or substituted phenoxy groups, optionally functionalized with cation groups; and
wavy line denotes connection to polymer or to R.

(c) Bisannulated Benzo Motifs:

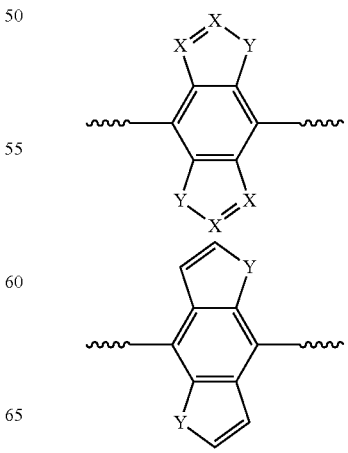

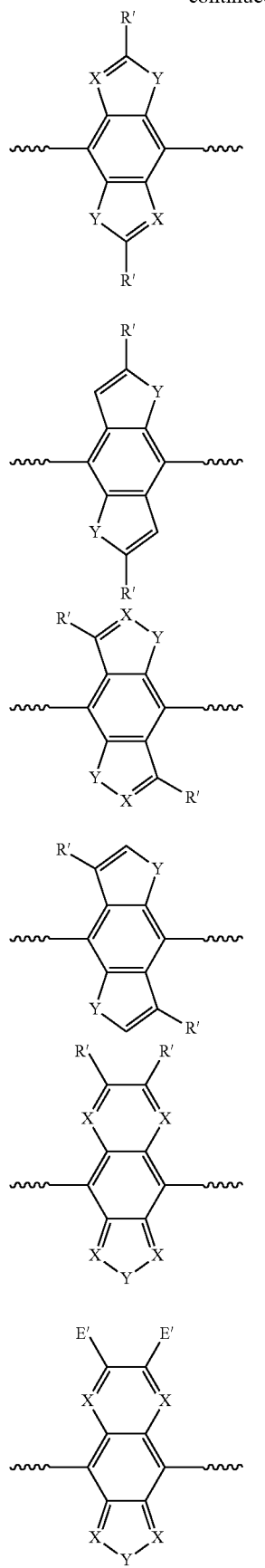
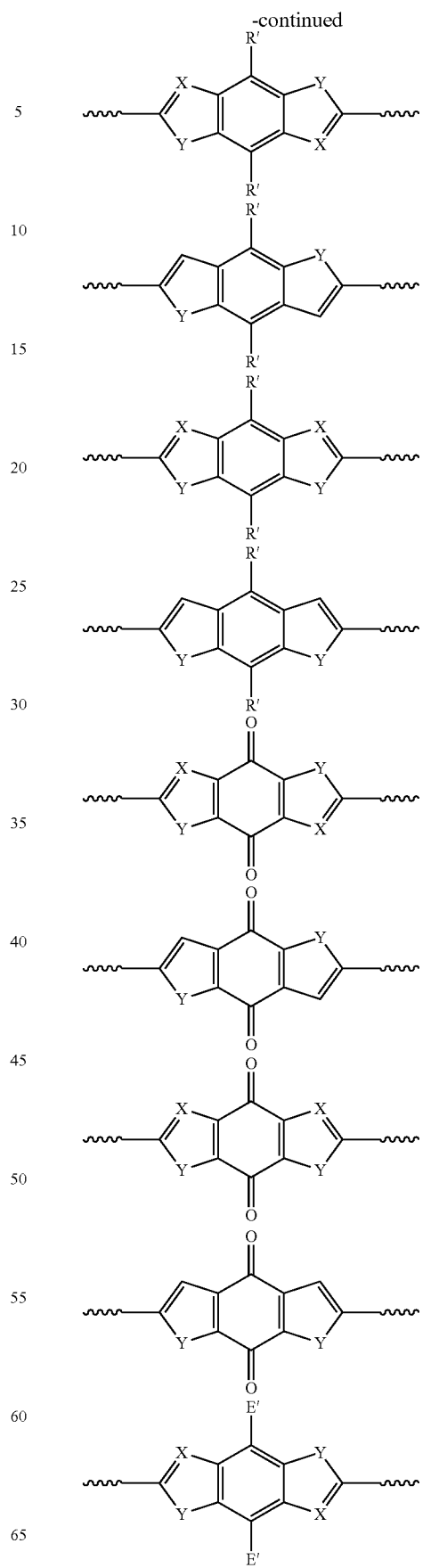

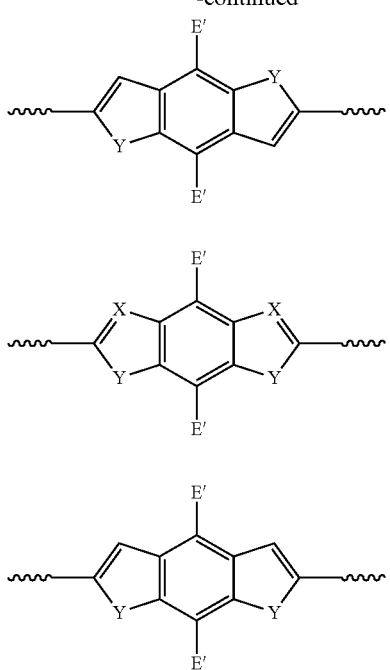

wherein

X=N;

Y=S, Se, O, N(R), S=O, S(=O)$_2$;

E'=H, F, CF$_3$, CN, NO$_2$, NMe$_3$$^+$;

R=alkyl, cycloalkyl, phenyl, substituted phenyl groups, substituted heterocyclic groups, alkoxy, phenoxy or substituted phenoxy groups, optionally functionalized with cation groups;

R'=H, alkyl, cycloalkyl, phenyl, substituted phenyl groups, substituted heterocyclic groups, alkoxy, phenoxy or substituted phenoxy groups, optionally functionalized with cation groups; and wavy line denotes connection to polymer or to R.

(d) Monoannulated Naphtho Motifs:

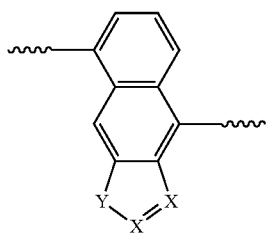

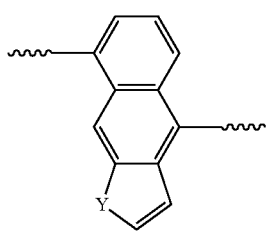

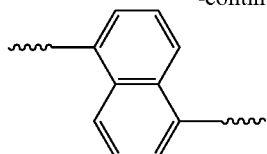

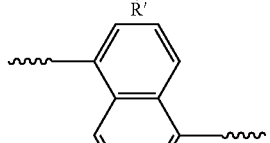

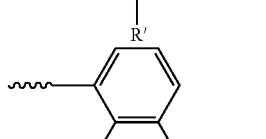

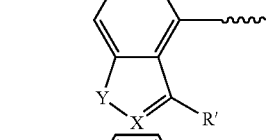

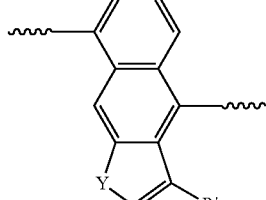

wherein

X=N;

Y=S, Se, O, N(R), S=O, S(=O)$_2$;

R'=H, alkyl, cycloalkyl, phenyl, substituted phenyl groups, substituted heterocyclic groups, alkoxy, phenoxy or substituted phenoxy groups, optionally functionalized with cation groups;

R=alkyl, cycloalkyl, phenyl, substituted phenyl groups, substituted heterocyclic groups, alkoxy, phenoxy or substituted phenoxy groups, optionally functionalized with cation groups; and wavy line denotes connection to polymer or to R.

(e) Bisannulated Naphtho Motifs:

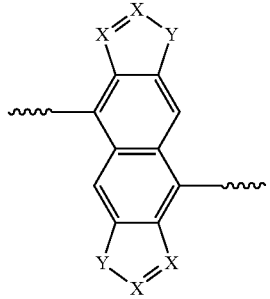

-continued

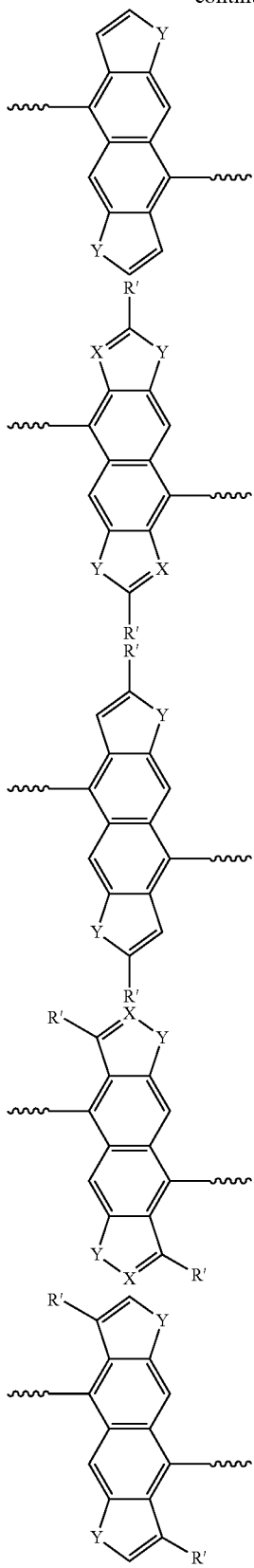

wherein
X=N;
Y=S, Se, O, N(R), S=O, S(=O)₂;

E'=H, F, CF₃, CN, NO₂, NMe₃⁺;

R'=H, alkyl, cycloalkyl, phenyl, substituted phenyl groups, substituted heterocyclic groups, alkoxy, phenoxy or substituted phenoxy groups, optionally functionalized with cation groups;

R=alkyl, cycloalkyl, phenyl, substituted phenyl groups, substituted heterocyclic groups, alkoxy, phenoxy or substituted phenoxy groups, optionally functionalized with cation groups; and wavy line denotes connection to polymer or to R.

(f) Monoannulated Heterocylic Motifs:

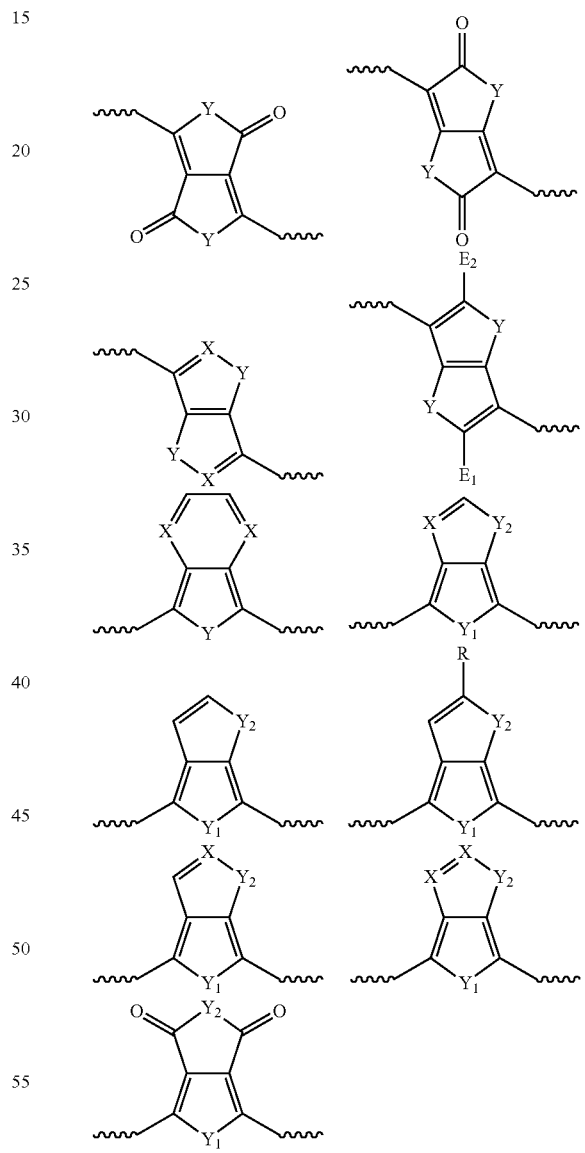

wherein X=N;
Y, Y₁, Y₂=S, Se, O, N(R), S=O, S(=O)₂;
E'=H, F, CF₃, CN, NO₂, NMe₃⁺;
R'=H, alkyl, cycloalkyl, phenyl, substituted phenyl groups, substituted heterocyclic groups, alkoxy, phenoxy or substituted phenoxy groups, optionally functionalized with cation groups;

R=alkyl, cycloalkyl, phenyl, substituted phenyl groups, substituted heterocyclic groups, alkoxy, phenoxy or substituted phenoxy groups, optionally functionalized with cation groups; and wavy line denotes connection to polymer or to R.

(g) Pyridine and Benzene Motifs:

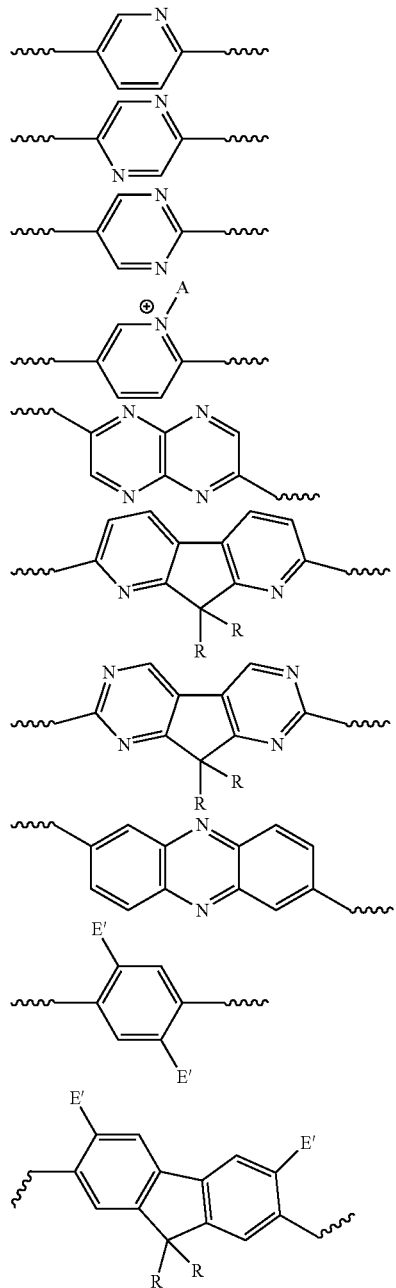

wherein
A=$CH_3$, $O^-$, $BF_3^-$, $BC_5H_5^-$;
E'=H, F, $CF_3$, CN, $NO_2$, $NMe_3^+$;
R=alkyl, cycloalkyl, phenyl, substituted phenyl groups, substituted heterocyclic groups, alkoxy, phenoxy or substituted phenoxy groups, optionally functionalized with cation groups; and
wavy line denotes connection to polymer or to R.

(h) Pyrylium Motifs:

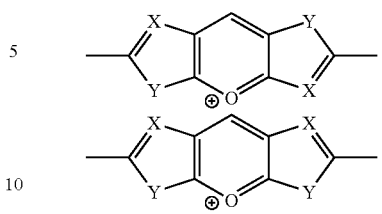

wherein
X=N;
Y=S, Se, O, N(R), S=O, S(=O)$_2$;
R=alkyl, cycloalkyl, phenyl, substituted phenyl groups, substituted heterocyclic groups, alkoxy, phenoxy or substituted phenoxy groups, optionally functionalized with cation groups; and
wavy line denotes connection to polymer or to R.

In particular, the electron-deficient aromatic moiety may be, but not limited to, substituted or unsubstituted: benzothiadiazole, benzobisthiadiazole benzooxadiazole, benzobisoxadiazole, benzimidazole, indazole, benzotriazole, perylenetetracarboxydiimide, napthalenetetracarboxydiimide, diketopyrrolopyrrole, thienopyrrole, thiadiazoloquinoxaline, napthothiadiazole, napthobisthiadiazole, indenofluorene, 2,5-difluorobenzene, fluorene, or a combination thereof.

According to another particular aspect, the polymer may be fully-conjugated or partially-conjugated.

For example, if the electron-deficient aromatic moiety is part of the polymer backbone, it may form a fully-conjugated polymer optionally with other repeating units. These may include, but are not limited to, oxygen, sulphur, aromatic, and/or heteroaromatic units, such as, but not limited to, fluorene, indenofluorene, phenylene, arylene vinylene, thiophene, azole, quinoxaline, benzothiadiazole, oxadiazole, thienothiophene, or arylamine. An example of a fully-conjugated copolymer formed with another repeating unit is the polymer represented by the two repeating units (N,N'-bis(2-octyldodecyl)-1,4,5,8-napthalenetetracarboxidiimide-2,6-diyl-alt-5,5'-(2,2'-bithiophene)).

Alternatively, the electron-deficient aromatic moiety may form a partly-conjugated polymer that is interrupted along its backbone by non-conjugating units. Such units include, but are not limited to, bisphenol-A, methacrylate, siloxane, and meta-linked benzene. An example of a partly-conjugated polymer copolymer is the polymer formed by the two repeating units N,N'-bis(2-octyldodecyl)-1,4,5,8-napthalenetetracarboxidiimide-2,6-diyl and bisphenol-A.

Alternatively, the electron-deficient aromatic moiety may be a pendant group attached to a polymer backbone. Examples of such polymer backbones include, but are not limited to, poly(methacrylate), and vinyl polymers. The choice of the backbone is determined by considerations of stability, processing characteristics, compatibility with the desired electron-deficient moiety, and ease of functionalization. The molecular weight of the polymer may be 2-200 kDa, 5-175 kDa, 10-150 kDa, 15-125 kDa, 20-100 kDa, 25-75 kDa, 30-50 kDa, 35-45 kDa. In particular, the polymer may have a molecular weight of 5-200 kDa.

The electron-deficient aromatic moiety may also be linked together to form dimers and higher multimers of the electron-deficient unit. The dimers and higher multimers may beneficially reduce chemical reactivity, improve stability and $E_A$ of the electron-deficient aromatic moiety.

According to a particular aspect, at least one hydrogen on an aromatic ring of the electron-deficient aromatic moiety may be substituted with a group comprising, but not limited to: alkyl, cycloalkyl, phenyl, substituted phenyl, substituted heterocyclic, alkoxy, phenoxy, substituted phenoxy, alkylthio, phenylthio, substituted phenylthio, fluorine, cyano, nitro, alkylketo, trichloromethyl, or trifluoromethyl. Such a substitution may help in improving processability in the target solvent and/or to modify $E_A$. For example, substituting at least one H with any of alkyl, cycloalkyl, phenyl and substituted phenyl groups may improve the processability of the electron-deficient aromatic moiety in target solvents. Likewise, substituting at least one H with any of alkoxy, phenoxy and substituted phenoxy groups may improve processability of the electron-deficient aromatic moiety in the target solvent and decrease $E_A$, while substituting at least one H with any of fluorine, cyano, nitro, alkylketo, trichloromethyl or trifluoromethyl groups may improve processability of the electron-deficient aromatic moiety in the target solvent and increase $E_A$. This enables fine-tuning of the $E_A$ of the chosen electron-deficient aromatic moiety and hence of the polymer in which the electron-deficient aromatic moiety is comprised.

In particular, the alkyl part of the substituent may comprise 1-10 carbons atoms. Even more in particular, the substituent may comprise straight-chain or branched-chain alkyl groups having 1-4 carbon atoms such as, methyl, ethyl, n-propyl, iso-propyl, n-butyl, and t-butyl.

The at least one counter-cation covalently bonded to the polymer or to a further polymer comprised in the material may be any suitable counter-cation for the purposes of the present invention. For example, the counter-cation may be a hydrophobic, non-electrophilic and/or weakly electrophilic cation and have good reductive stability. According to a particular aspect, the counter-cation may be, but not limited to, substituted or unsubstituted ammonium, morpholinium, piperidinium, pyrrolidinium, sulfonium, phosphonium, and their substituted analogues.

For example, the ammonium may be $R_4N^+$, where R is preferably $C_1$-$C_{12}$ alkyl or phenyl. The sulfonium may be $R_3S^+$ where R is $C_1$-$C_{12}$ alkyl or phenyl. The phosphonium may be $R_4P^+$ where R is $C_1$-$C_{12}$ alkyl or phenyl.

According to a particular aspect, the at least one counter-cation may be an aromatic heterocycle cation. Examples of such cations may include, but are not limited to, pyridinium, imidazolium, pyrrolium, pyrylium, and their substituted analogues.

In particular, the at least one counter-cation may be alkylated ammonium, morpholinium, imidazolium or a combination thereof.

The counter-cation needs to have good reductive stability. Reductive stability may be defined as the ability of a chemical moiety to resist electrochemical reduction. This may be assessed by the electrode potential for reduction of the chemical moiety. The counter-cation should therefore not undergo electrochemical reduction up to an electrode potential of −3 V vs Standard Hydrogen Electrode (SHE). According to a particular aspect, the counter-cation may be non-hygroscopic to avoid physisorption of water, thereby having good reductive stability.

According to another particular aspect, the counter-cation may be non-electrophilic. Non-electrophilic cations do not take part in electrophilic reactions. For example, non-electrophilic cations may be but not limited to alkylated ammonium, morpholinium or imidazolium.

The counter-cation may be covalently bonded to the polymer or to a further polymer comprised in the material. In particular, the counter-cation may be attached to a polymer directly or through a short spacer chain, such as an alkyl chain such as —$(CH_2)_x$— where x is 1-8, preferably 2-4; a perfluoroalkyl chain such as —$(CF_2)_x$— where x is 1-8, preferably 2; an alkoxy chain—$(OCH_2CH_2)_x$—, where x is 1-3, preferably 1; or a perfluoroalkoxy chain —$(OCF_2CF_2)_x$—, where x is 1-3, preferably 1.

The polymer may be the one that contains the conjugated moiety, or a separate polymer provided for the purpose of attaching the counter-cation. Examples of such separate polymers include, but are not limited to: vinyl polymers, such as quaternized polyallyamine, quaternized poly(ethyleneimine), poly(diallydimethylammonium); and acrylate polymers with quaternized amino side-chains.

The optimum spacer length may be determined empirically because this varies with the exact structure of the polymer. The processability of the polymer whether in the undoped precursor form or n-doped form is affected by competition between hydrophobicity of the π-conjugated core and side chains and the ionic character of the counter-cation together with the electron and spectator ion if any.

The ratio of cation equivalent to n-doped electron-deficient aromatic moiety, denoted by f, may be 1-5. In particular, f may be 1-4 or 2-3. Even more in particular, f may be 1-3. A singly charged counter-cation may be counted as one equivalent. The f ratio determines the fractional excess of counter-cations in the material which requires spectator anions to counter-balance. The fractional spectator anion required may be given by:

$$f-1.$$

If f=1, the number of counter-cations is just sufficient to self-compensate for the number of electrons on the material. The fully self-compensated n-doped electrically conductive material may exist in the zwitterionic form where the negative and bound positive charges are exactly in balance. In this case, the electrons may be fully counterbalanced by the covalently-bonded counter-cations. If f<1, the n-doped material is not fully self-compensated, and therefore, free counter-cations need to be present.

According to a particular aspect, all the counter-cations comprised in the self-compensated material may be immobilised such that any electron in the polymer cannot significantly diffuse or migrate out of the polymer. This may therefore achieve a stable doping level that does not degrade during processing, storage or device operation. In particular, it may be desirable if a graded doping profile may be accomplished in the EIL through sequential deposition of materials with a progressively changing doping level.

If on the other hand f>1, the number of counter-cation equivalent is larger than the number of n-doped electron-deficient aromatic moiety. Hence, the fraction of cations given by f−1 will need to be compensated by spectator anions. In this case, the spectator ions may be advantageously employed to impart solvent processability to the undoped precursor material. This may be beneficial for solution-state doping. The spectator ions may further impart solvent processability to the fully- or heavily-n-doped polymer, depending on its choice.

For example, for a model alternating copolymer of NDIC3NMe3OTf-TT that for doping level of one electron per repeat unit, and f=2, the polymer remains soluble in dimethyl sulfoxide. However, for higher doping levels, the polymer may become insoluble and may therefore precipitate out.

The covalently bonded counter-cation may help to solubilize the polymer in the desired processing solvent. The nature and number density of these counter-cations modify the morphology and coulombic interactions within the ionic clusters comprising counter-cations, electrons and spectator anions in the n-doped material. Through interactions with the solvent, the counter-cation may provide enthalpic and entropic contributions to solvation energetics, and hence a degree-of-freedom to improve solubility of the material. For example, NDIC3NMe3OTf-TT may be soluble in dimethyl sulfoxide and propylene carbonate, but the bis(3-(4-methylmorpholinio)propyl analogue (NDIC3MorOTf-TT) is in addition soluble in acetonitrile.

The counter-cation may also affect the workfunction (WF) of the n-doped material. In particular, because the mobile electrons on the electron-deficient aromatic moieties are counter-balanced by counter-cations which may be bonded to the same polymer backbone, or to another polymer provided specifically for the counter-cations, the bonded cations confer chemical, thermal and processing stability to the n-doped state, preventing the loss or transfer of doping during device processing, storage and operation. These materials thus overcome a key challenge to give stable n-doped films with WF between 2.5 and 4.5 eV, which can serve as EILs and EELs in devices. Thus, it is desirable to have the WF of EILs shallower than 4.5 eV, preferably in the range of 2.5-4.5 eV, and more preferably in the range of 3-4 eV, to match the $E_A$ of the desired semiconductor.

The counter-cation may be covalently bonded to the polymer by any suitable method. In particular, the counter-cations may be provided on the polymer by pre- or post-functionalization, depending on ease of synthesis and purification, and the characteristics of the resultant material. For example, the counter-cation may be incorporated into the monomer which is then polymerized. Alternatively, the counter-cation may be functionalized into the polymer post-polymerization using a suitable chemistry.

The material may further optionally comprise at least one spectator anion. The spectator anion may be any suitable anion. The spectator anion may be selected based on the structure of the material as well as the solvent to be used in preparing the material. The incorporation of spectator anions may be advantageous to modify the solvent processability characteristics of the material, including solubility and rheology. The spectator anion may also affect the workfunction of the n-doped material. For example, the one or a plurality of spectator anions may be selected from the group of anions comprising, but not limited to: halides such as $Cl^-$, $Br^-$, $I^-$; pseudohalides such as $OCN^-$; sulfonates such as fluoroalkyl sulfonates, alkyl sulfonates, phenyl sulfonates; and non-nucleophilic anions including sulfonimides such as bis(trifluoromethane)sulfonimide), tetrafluoroborate, hexafluorophosphate, hexafluoroantimonate.

The spectator anion may help to solubilize the n-doped polymer in the desired processing solvent. The nature and number density of the spectator anion may modify the morphology and coulombic interactions within the ionic clusters comprising counter-cations, electrons and spectator anions in the n-doped material. Through interactions with the solvent, the spectator anion may provide enthalpic and entropic contributions to solvation energetics, and hence a degree-of-freedom to improve solubility of the material.

The presence of non-bonded spectator anions does not result in loss of stability of the doping profile, different from the presence of non-bonded counter-cations. This is because the mobile electrons can diffuse or migrate together with the non-bonded cations, but not the non-bonded anions, as neutral entities, resulting in transfer of doping to an adjacent semiconductor layer, or to adventitious impurities in the processing solvent, and loss of doping in the intended EIL or EEL.

For example, the small $I^-$ spectator anion in NDIC3NMe3I-TT polymer its confers solubility in dimethyl sulfoxide, whereas the analogue with a larger triflate anion confers solubility in aprotic polar solvents as well, such as propylene carbonate.

The spectator anion may be included in the material by any suitable method. For example, the material may comprise the covalently-bonded cations counter-balanced by the spectator anion such as $I^-$ or $Br^-$ in the undoped precursor material, depending on the chemical process used. Several ways may be available to exchange the desired spectator anion or anions into the material before n-doping. These include, but are not limited to dialysis, ion-exchange resin, or metathesis.

In the dialysis method, the material may be dissolved in a suitable solvent and kept on one side of a suitable dialysis membrane. A suitable salt of the target anion or anions is dissolved into a suitable solvent and placed either on the same side or opposite side of the membrane. The membrane may be made, for example, of cellulose or polyethersulfone. As dialysis proceeds, the dialysate is refreshed and gradually replaced with pure solvent. In this way, ion exchange takes place and excess ions are removed from the material. The material may be purified by dialysis until the desired ionic purity is obtained, for example sub-1% ionic impurities.

In the ion-exchange resin method, the desired anion may first be inserted in the usual way into a suitable ion-exchange resin, which is then placed in contact with the material in solution for the ion exchange to take place.

In the metathesis method, the material may be mixed with a suitable salt of the target anion to precipitate an insoluble salt. One way to accomplish this is to prepare the $Ag^+$ salt with the target anion, such as triflate, to react with the original halide, such as a bromide or an iodide, and then remove the silver halide formed by filtration or centrifugation.

According to a particular aspect, the material may comprise at least, but not limited to:

poly(2,5-bis(3-trimethylammoniopropyl-3-(5-(thieno[3,2-b]thiophen-2,5-yl)thiophen-2-yl)-6-(thiophen-2,5-yl)pyrrolo[3,4-c]pyrrole-1,4(2H,5H)-dione)triflate] (DPPT2C3NMe3OTf-TT);

poly{[N,N'-bis(3-trimethylammoniopropyl)-naphthalene-1,4,5,8-bis(dicarboximide)-2,6-diyl]-alt-[2,5-(thieno[3,2-b]thiophene)]iodide} (NDIC3NMe3I-TT);

poly{[N,N'-bis(3-trimethylammoniopropyl)-naphthalene-1,4,5,8-bis(dicarboximide)-2,6-diyl]-alt-[2,5-(thieno[3,2-b]thiophene)]triflate} (NDIC3NMe3OTf-TT);

poly{[N,N'-bis(3-(4-methylmorpholino)propyl)-naphthalene-1,4,5,8-bis(dicarboximide)-2,6-diyl]-alt-[2,5-(thieno[3,2-b]thiophene)]triflate} (NDIC3MorOTf-TT);

poly{[N,N'-bis(3-trimethylammoniopropyl)-naphthalene-1,4,5,8-bis(dicarboximide)-2,6-diyl]-alt-[5,5'-(2,2'-bithiophene)triflate}, (NDIC3NMe3OTf-T2);

poly{[9,9'-bis(3-trimethylammoniopropyl)fluorenyl-2,7-diyl]-alt-(benzo[2,1,3]thiadiazole-4,8-diyl)triflate} (BT-F3NMe3OTf); or poly{[9,9'-bis(3-trimethylammoniopropyl)fluorenyl-2,7-diyl]-alt-(9,9'-dioctylfluorenyl-2,7-diyl)} (F3NMe3OTf-F8).

The $E_A$ of the material may be selected between 2.5 eV to 4.5 eV. As an example, the electron-deficient aromatic moiety may be 1,4,5,8-napthalenetetracarboxidiimide-2,6- diyl (gas phase $E_A$, 2.8 eV) selected from the functionalized polycyclic aromatic motifs, the co-monomer unit may be thieno[3,2-b]thiophene-5,5'-diyl, the bonded counter-cation may be 3-trimethylammoniopropyl, and the spectator anion may be triflate. The resultant material, NDIC3NMe3OTf-TT, has $E_A$ of 4.3 eV. The WF for the heavily n-doped polymer (0.1-1 electron per repeat unit) is 4.3 eV and the WF is 3.7 eV when in contact with a pyrrolo[3,4-c]pyrrole-1,4 (2H,5H)-dione polymer.

In another example, the electron-deficient aromatic moiety may be (thiophen-2,5-yl)pyrrolo[3,4-c]pyrrole-1,4(2H, 5H)-dione) (gas phase $E_A$, 2.1 eV) from the monoannulated heterocyclic motifs (group 5), the co-monomer unit may be thieno[3,2-b]thiophene-5,5'-diyl, the bonded counter-cation may be 3-trimethylammoniopropyl, and the spectator anion may be triflate. The resultant material, DPPT2C3NMe3OTf-TT, has $E_A$ value of 3.6 eV. The WF obtained for the heavily n-doped polymer (0.75 electron per repeat unit) is 3.8 eV.

The excess negative charge in the n-doped state of the material should be delocalized. Preferably, the excess negative charge on any carbon atom in the π-electron system does not exceed 0.2 electron, more preferably it does not exceed 0.1 electron, most preferably it does not exceed 0.05 electron. This may be evaluated by high-quality quantum chemical calculations.

Many combinations of structures may be available to generate the conjugated polymer or oligomer with the desired $E_A$, through the choice of the moieties, its substituents, and the copolymer unit, if any. These combinations of the π-conjugation structures and their modifications may achieve the required $E_A$ to produce the desired low workfunction n-doped materials.

The workfunction may be measured by any suitable method. For example, the WF may be measure in ultraviolet photoemission spectroscopy from the kinetic energies at the Fermi level and the low-energy cutoff of the sample to determine the vacuum level, as described for example in Hwang J. H. et al, Mater. Sci. Eng. R 64:1, 2009. This gives the vacuum WF. The solid-state ionization potential ($I_p$) of the material may be measured in the same experiment from extrapolation of the photoemission onset to define $I_p$, as described also in that reference. All ionization potentials and workfunctions referred to in this invention were measured this way. Other ways to measure $I_p$ include cyclic voltammetry, which may be complicated by counter-ion effects, and an ambient photoemission technique often called AC2. The $E_A$ may be estimated from $I_p$ of the polymer and the absorption spectrum of the polymer to find the band gap ($E_g$), and then subtracting the $E_g$ from $I_p$ and further subtracting the exciton binding energy (typically 0.5 eV). Other ways to measure $E_A$ includes inverse photoemission spectroscopy.

The electrical conductivity may be measured by any suitable method. For example, the standard four-probe force-sense measurement method may be used. Alternatively, the suitability of the EIL/EEL can be directly assessed in the device configuration by capacitance-voltage measurements as a function of dc bias and frequency. The capacitance is preferably constant up to 10 MHz and substantially independent of bias between −3 and +3 V.

According to a second aspect, the present invention provides a composition comprising the material according to the first aspect and a polymer diluent. The polymer diluent may be any suitable polymer diluent for the purposes of the present invention.

For example, the one or a plurality of polymer diluent may preferably be selected from the group of polymers that may have favourable interaction with the n-doped material, subject to the requirements of reductive stability and low electrophilicity. Examples of such polymers include poly ethylene glycol.

In particular, the one or a plurality of polymer diluents may be advantageously incorporated to give a composition that comprises the n-doped electrically-conductive material with bonded counter-cations and optionally with one or a plurality of non-bonded spectator anions, and one or a plurality of polymer diluents. The incorporation of polymer diluents may be advantageous to modify the electrical and optical properties of the composition.

To generate the n-doped materials and compositions, optionally in a separate step after synthesis, a strong reductant (also called n-dopant) is applied to dope the material, followed by excess ion removal to give self-compensation. These two steps of doping and self-compensation may be performed sequentially or simultaneously. Suitable n-dopants enable the n-doping of polymer OSCs with suitable $E_A$ to ultimately give a WF in the range of 2.5-4.5 eV.

The two steps may be performed on the undoped precursor material in solution to generate the self-compensated n-doped material in solution. This is called solution-state doping method. The n-doped materials may then be deposited and patterned on the desired substrate by spin-casting, inkjet printing, doctor blading or other suitable methods.

Alternatively, the two steps may be performed on films of the undoped precursor material that has been deposited and patterned on a substrate by a suitable method described above, including layer-by-layer polyelectrolyte assembly. In layer-by-layer polyelectrolyte assembly, a polycation and polyanion, either or both comprising the undoped precursor material, are alternately assembled by adsorption on the electrode or substrate to build the film. In addition, a photolithography patterning method may be used. In this method, the film may contain photocrosslinkable moieties which are activated by light that is illuminated through a mask to pattern the film. Alternatively, the film may be patterned by etching or dissolving away areas exposed by a photoresist mask layer that has been fabricated over the film. The film may then be exposed to the n-dopant in solution and then to a suitable solvent mixture to accomplish the self-compensation step. This is called film-state doping method.

According to a third aspect, there is provided a method of preparing a material described above, the method comprising:
  preparing a mixture comprising a polymer and at least one counter-cation covalently bonded to the polymer or to a further polymer, the polymer comprising at least one electron-deficient aromatic moiety, each electron-deficient aromatic moiety having a gas-phase electron affinity ($E_A$) of 1-3 eV;
  doping the polymer with a n-dopant to form a n-doped polymer, wherein the n-dopant is a reductant with a formal reduction potential smaller than about −1.3 V versus a Standard Hydrogen Electrode; and
  removing excess mobile counter-cations to form the material.

According to a particular aspect, the method may further comprise depositing a layer of the mixture on a surface of a substrate prior to the doping. The substrate may be any suitable substrate for the purposes of the present invention. The method may further comprise patterning the layer prior to the doping following the depositing. The depositing and patterning may be by any suitable method for the purposes of the present invention.

The polymer, counter-cation and electron-deficient aromatic moiety may be as described above.

The preparing, doping and removing may be by any suitable method for the purposes of the present invention.

In particular, the removal of the excess mobile counter-cations may comprise removing the excess mobile counter-cations as salts to form the material. This may be achieved, for example, by precipitating the material with a solvent for the salt but a non-solvent for the material, or by washing the material film with a solvent for the salt but a non-solvent for the material film.

As a consequence of the wide $E_A$ range of the electron-deficient aromatic moieties, n-doping has to be accomplished using a n-dopant that has a much higher oxidation potential than a hydroxyl radical or base. The formal reduction potential $E°$ of a reductant measures the thermodynamic ability of the reductant to transfer electron to reduce another material. A dopant that has a lower $E°$ value is a stronger n-dopant. The E value of a proton in aqueous solution is 0.0 V vs SHE.

The n-dopant used in the doping may be any suitable n-dopant for the purposes of the present invention. The dopant may be selected based on the following considerations: (i) stability and processability, (ii) ease of subsequent purification to give the self-compensated n-doped material, (iii) benignity of residual cation, anion and neutral concentration to device performance.

For example, the n-dopant may be an electron-transfer reductant. In particular, the n-dopant may be a one-electron reductant. According to a particular aspect, the n-dopant may be, but not limited to, sodium metal in THF ($E°=-3.0$ V), sodium napthalenide ($E°=-3.1$ V), sodium benzophenone keyl ($E°=-2.3$ V) or sodium 9,10-diphenylanthracenide ($E°=-2.1$ V). According to another particular aspect, the n-dopant is just sufficiently strong to n-dope the polymer under the selected conditions of the method comprising solution-state doping or film-state doping. Sodium, sodium amalgam, sodium napthalenide, sodium benzophenone ketyl are very strong reductants suitable for polymers with $E_A$ down to 2.5 eV for both solution-state doping and film-state doping. Another suitable n-dopant is sodium 9,10-diphenylanthracenide or cobaltocene ($E°=-1.3$ V), decamethylcobaltocene ($E°=-1.9$ V).

For example, the n-dopant may be generated from a precursor n-dopant by heat or light activation to n-dope the polymer. According to a particular aspect, the precursor n-dopant may be, but not limited to derivatives of: 2-phenyl-1,3-dialkyl-2,3-dihydrobenzimidazole, 2-phenyl-1,2,3-trialkyl-2,3-dihydrobenzimidazole and 1,2,2,3-tetraalkyl-2,3-dihydrobenzimidazole. An example of a 2-phenyl-1,3-dialkyl-2,3-dihydrobenzimidazole is 2-(p-dimethylamino)phenyl-1,3-dimethyl-2,3-dihydrobenzimidazole, commonly known as DMBI, functionalised with at least one ionic group. This is useful to n-dope polymers with low $E_A$. The precursor dopant is mixed with the polymer at a desired ratio in solution and cast into film. The film is subsequently heated or exposed to light of appropriate wavelength in-situ to activate doping of the polymer without exposure to the processing ambient.

The desired doping level may be between about 0.1 electron per repeat unit to about 1.0 electron per repeat unit, more preferably between about 0.3 electron per repeat unit to about 0.8 electron per repeat unit. This may be checked using X-ray photoemission spectroscopy. Alternatively, this may be checked using UV-Vis spectroscopy by quantifying the fractional loss in the absorption band intensity of the π-π* band and rise in the n-doped band intensities.

The doping may be monitored in situ by UV-Vis spectroscopy for both solution-state and film-state doping to adjust the concentration of the n-dopant until the desired doping level is achieved.

The method may further comprise purifying the material to remove the mobile ionic by-products and obtain the desired self-compensated state of the material. In the case of solution-state doping, the purifying may be achieved by precipitating the n-doped material using a non-solvent for the material (but which dissolves the ionic by-products) and then re-dissolving the precipitated material in a suitable solvent. These steps may be repeated until the material reaches the desired purity. Non-polar or weakly polar solvents such as diglyme may be suitable for this purpose. The purity of the resultant self-compensated n-doped material may be quantified by infrared vibration spectroscopy through the absorption band intensities of the undesired ions.

In the case of film-state doping, purifying may be achieved by immersing the film in a suitable wash solvent. Moderately polar solvents such as diglyme, and solvent mixtures of a highly polar solvent such as nitromethane and a non-polar solvent such as dioxane may be suitable for this purpose.

According to a particular aspect, the removing may comprise contacting the n-doped polymer with a solvent. The solvent used may be any suitable solvent for the purposes of the present invention. In particular, the solvent may have a formal reduction potential smaller than about $-2$ V versus a Standard Hydrogen Electrode, preferably $-3$ V versus SHE, and a dielectric constant>20. The solvent may be selected having consideration to the n-dopant used and the polymer involved. Examples of suitable solvents include, but are not limited to, acetonitrile, N,N-dimethylacetamide, N-methylpyrrolidone, methoxyacetonitrile, propylene carbonate, ethylene carbonate and dimethyl sulfoxide. Protonic solvents are not suitable. The solvent or solvent mixture selected should have the appropriate volatility (boiling point) for the film deposition method chosen.

According to a fourth aspect, there is provided a layer comprising the material described above. In particular, the layer may have a vacuum WF of 2.5-4.5 eV. The layer may be in any suitable form. For example, the layer may be in the form of a film.

According to a particular aspect, the layer may be an electron-injection layer (EIL) or an electron-extraction layer (EEL). In particular, the layer may form an ohmic electron-injection or electron-extraction contact to a semiconductor.

The layer may have a thickness suitable for the purposes of the present invention. For example, the thickness of the layer may be 5-100 nm. In particular, the thickness of the layer may be 10-95 nm, 15-90 nm, 20-85 nm, 25-80 nm, 30-75 nm, 35-70 nm, 40-65 nm, 45-60 nm, 50-55 nm.

According to a fifth aspect, the present invention provides a device comprising the material or a layer described above. The device may be an organic semiconductor device. For example, the material may be applied as EILs in diodes, including light-emitting diodes and photoconductive diodes, and field-effect transistors.

In the case of light-emitting diodes, the EIL may be fabricated to a thickness of 5 to 100 nm, preferably 30 to 50 nm, over the light-emitting semiconductor layer or a plurality of light-emitting semiconductor layers. The EIL may be deposited directly in the doped form or in the undoped precursor form and then doped. Optionally, the EIL may be patterned by photolithography or other methods. The cathode, which may be made, for example, of a metal or composite layered structure or transparent conducting oxide, may be deposited over the EIL.

Optionally, one or a plurality of buffer interlayers may be deposited over the light-emitting semiconductor layer before depositing the EIL. The cathode may then be deposited, which may be made, for example, of a metal or composite layered structure including LiF. Optionally, one or a plurality of buffer interlayers may be deposited over the anode before depositing the semiconductor layer. The buffer interlayers may perform roles including confinement of opposite carriers, confinement of excitons and assistance to carrier injection. Alternatively, the light-emitting diode may be fabricated in the reverse sequence.

In the case of field-effect transistors, the EIL may be fabricated to a thickness of 5 to 100 nm, preferably 5 to 20 nm, over an electrode array which may be made, for example, of a metal or a transparent conducting oxide. The EIL may preferably be aligned to the electrode array by photolithography or self-organization. The EIL may be deposited directly in the doped form or in the undoped precursor form and then doped.

In the photolithography method, the film may contain photocrosslinkable moieties which may be activated by light illuminated through a mask to pattern the film. Alternatively, the film may be patterned by etching or dissolving away areas exposed by a photoresist mask layer that has first been fabricated on the film. In the self-organization method, the EIL may be self-aligned to the electrode array by chemical interactions.

The semiconductor may then deposited over the EIL, followed by one or a plurality of gate dielectric layers, and a patterned gate electrode. The semiconductor layer may be patterned by photolithography. Alternatively, the field-effect transistors may be fabricated in the reverse sequence. In this case, an oxygen-plasma or an oxidant may be used to pattern the EIL.

The n-doped materials may be applied as EELs in photodiodes. In the case of photodiodes, the EEL may fabricated to a thickness of 5 to 100 nm, preferably 30 to 50 nm, over a light-absorbing photoactive semiconductor layer or a plurality of photoactive semiconductor layers. The EEL may be deposited directly in the doped form or in the undoped precursor form and then doped. Optionally, the EEL may be patterned by photolithography or other methods. The electron-collecting electrode, which may be made, for example, of a metal or composite layered structure or transparent conducting oxide, may be deposited over the EEL. Optionally, one or a plurality of buffer interlayers may be deposited over photoactive layer before the EEL layer. Optionally, one or a plurality of buffer interlayers may be deposited over the hole-collecting electrode before the photoactive layer. The buffer interlayers may perform roles including confinement of opposite carriers and assistance to carrier extraction. Alternatively, the photodiode may be fabricated in the reverse sequence.

In the case of tandem photodiodes, a first cell incorporating an EEL may be fabricated followed by a second cell incorporating an identical or dissimilar EEL.

Other devices may be construed, including sensors, supercapacitors, transducers, actuators and electrochromic devices employing the ultralow-workfunction EIL/EEL, following the general principles above.

Since the doped material is not in an aqueous solution, the EIL or EEL layer may be advantageously fabricated over other layers without dewetting problems.

Whilst the foregoing description has described exemplary embodiments, it will be understood by those skilled in the technology concerned that many variations may be made without departing from the present invention.

Having now generally described the invention, the same will be more readily understood through reference to the following examples which are provided by way of illustration, and are not intended to be limiting.

EXAMPLE

Example 1—Synthesis

Examples are outlined below for synthesis of polymers from the corresponding monomers to give various copolymers to illustrate the generality of the concept.

Example 1a—Synthesis of NDIC3NMe3I-TT (FIG. 1a)

To a 20-mL microwave-safe vial, equimolar quantities of diBr-NDIC$_3$NMe$_2$ (234.12 mg, 0.3365 mmol) and diSn-TT (156.70 mg, 0.3365 mmol) were added. Then Pd$_2$(dba)$_3$ catalyst (6.16 mg, 2 mol %) and p-o-(tol)$_3$ (8.19 mg, 8 mol %) was added and the vial was crimp-sealed. The vial was purged pumped down to vacuum and backfilled with argon thrice. A thoroughly degassed anhydrous chlorobenzene solvent (18 ml) was added into the vial to dissolve the monomers. The reactant solution was further degassed (15 min). The reaction vial was loaded into a Biotage microwave synthesizer and rapidly heated to the selected polymerization condition (2 min 110° C., 2 min 130° C. and 26 min 150° C.). The crude neutral polymer is precipitated in hexane. The crude neutral polymer is immediately functionalized to the ionic form post-polymerisation. 100 mg of crude NDIC$_3$NMe$_2$-TT polymer was added to a 20 ml microwave vial. The vial was crimp-sealed before it was pumped down to vacuum and backfilled with argon thrice. Me-I (1 ml, 100 eq) was added followed by addition of 18 ml of methanol. The reaction vial was heated for 2 hrs at 80° C. When cooled down to room temperature, the polymer was first extracted into acetonitrile and the reaction solvents together with volatile methyl iodide were rotavaped to dryness. Polymer was redissolved in minimal DMSO polymer and reprecipitated in toluene and dried overnight under vacuum. The structure of the title polymer is confirmed by $^1$H NMR and X-ray photoemission spectroscopy.

Example 1b—Synthesis of NDIC3NMe3OTf-TT (FIG. 1b)

NDIC3NMe3I-TT (100 mg, 0.117 mmol, 1 eq) was dissolved in 4 mL DMSO in a vial. In a separate vial, silver triflate (66.01 mg, 0.256 mmol, 2.2 eq) was dissolved in 660 µL of methanol. The silver triflate solution was added to the NDIC3NMe3I-TT solution and stirred at room temperature for 15 min. The solution was filtered through a 0.45 µL nylon filter to remove AgI. The polymer was reprecipitate in CHCl$_3$, washed with water to remove excess AgOTf and dried overnight under vacuum. The structure of the title polymer was confirmed by X-ray photoemission spectroscopy.

Example 1c—Synthesis of NDIC3MorOTf-TT (FIG. 1c)

As in Example 1a and Example 1b, but with diBr-NDIC$_3$Mor (228.28 mg, 0.3365 mmol) in place of diBr-NDIC$_3$NMe$_3$. Polymerisation and functionalization process conditions remained the same. The structure of the title polymer was confirmed by $^1$H NMR and X-ray photoemission spectroscopy.

Figure 1D:
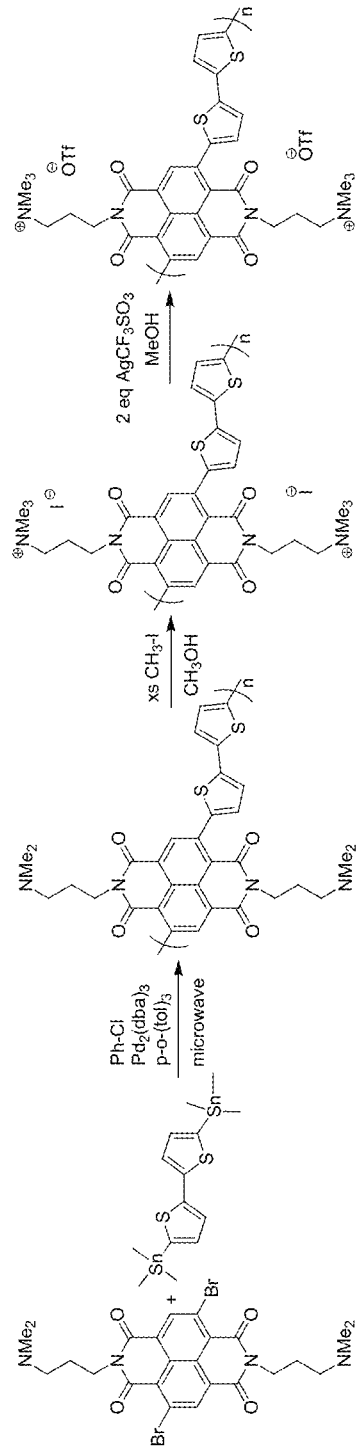

Example 1d—Synthesis of NDIC3NMe3OTf-T2 (FIG. 1d)

As in Example 1a and Example 1b, but with diSn-T2 (165.53 mg, 0.3365 mmol) in place of diSn-TT. Polymerisation and functionalization process conditions remained the same. The structure of the title polymer was confirmed by $^1$H NMR and X-ray photoemission spectroscopy.

Figure 1E:
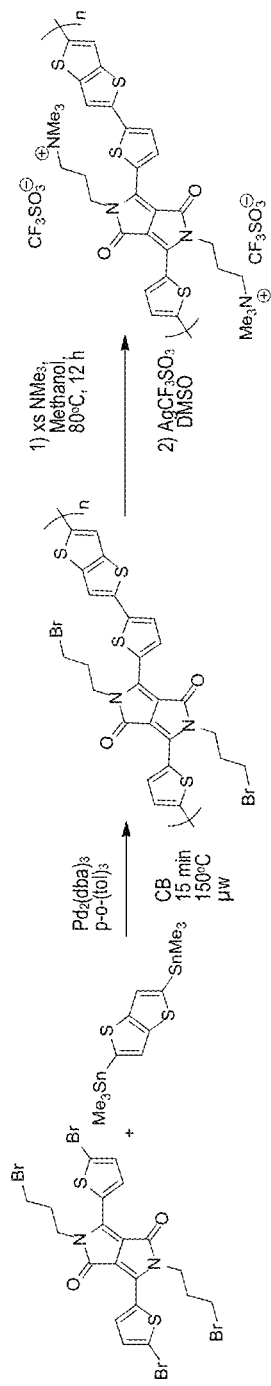

Example 1e—Synthesis of DPPT2C3NMe3OTf-TT (FIG. 1e)

To a 20-mL microwave-safe vial, equimolar quantities of diBr-DPPTC$_3$Br (234.12 mg, 0.3365 mmol) and diSn-TT (156.70 mg, 0.3365 mmol) were added. Then Pd$_2$(dba)$_3$ catalyst (6.16 mg, 2 mol %) and p-o-(tol)$_3$ (8.19 mg, 8 mol %) was added and the vial was crimp-sealed. The vial was purged pumped down to vacuum and backfilled with argon thrice. A thoroughly degassed anhydrous chlorobenzene solvent (18 ml) was added into the vial. This resulted in solubilisation of the monomers. The reactant solution was further degassed (15 min). The reaction vial was loaded into a Biotage microwave synthesizer and rapidly heated to the selected polymerization condition (2 min 110° C., 2 min 130° C. and 26 min 150° C.). The crude neutral polymer was precipitated in hexane. The crude neutral polymer was functionalized to the ionic form post-polymerisation. To a 20 ml microwave vial, 100 mg of crude NDIC$_3$NMe$_2$-TT polymer was added. The vial was crimp-sealed before it was purged pumped down to vacuum and backfilled with argon thrice. Trimethylamine, 31-35 wt. % in ethanol, 4.2 M (8 ml, 100 eq) is added to vial followed by addition of 12 ml of methanol. The reaction vial was heated at 70° C. for 12 hr. When cooled down to room temperature, polymer was first extracted into acetonitrile are rotavaped to dryness. Polymer is redissolved in minimal DMSO polymer and reprecipitated in toluene to retrieve pure title polymer upon drying overnight under vacuum. DPP-T2C3NMe3Br-TT was further ion exchanged to DPP-T2C3NMe3OTf-TT by reacting the DPP-T2C3NMe3Br-TT with 2 eq silver triflate in DMSO as in Example 1b. The structure of the title polymer is confirmed by $^1$H NMR and X-ray photoemission spectroscopy.

Figure 1F:
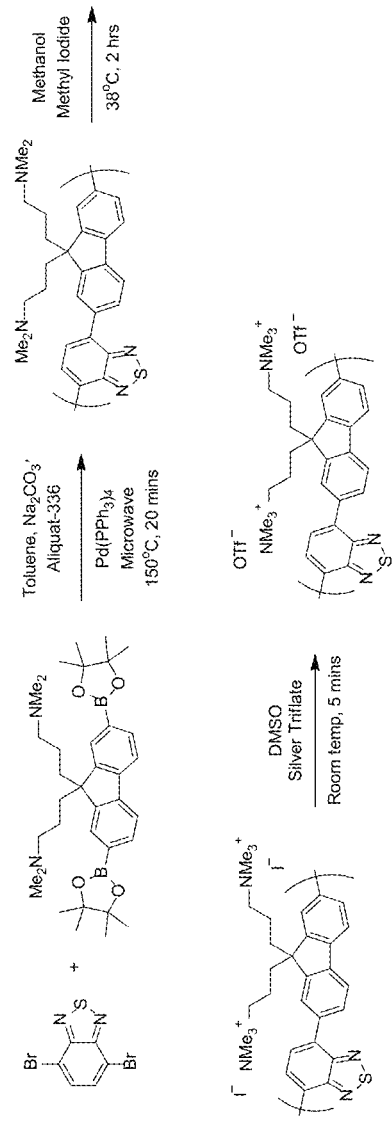

Example 1f—Synthesis of BT-F3NMe3OTf (FIG. 1f)

To a 20-ml microwave vial, equimolar amounts of BT-diBr (74.94 mg, 0.2549 mmol), F3NMe2-diEs (150.00 mg, 0.2549 mmol) and Pd(PPh3)4 (2 mol %, 5.89 mg, 0.00510 mmol) were added. The vial was crimp sealed, pump down to vacuum and backfilled with Argon thrice. Degassed toluene (15 ml), with dissolved Aliquat-336 (0.15 ml), was added into the vial to dissolve the monomers. Na$_2$CO$_3$ solution in deionized water (10 equiv, 1M, 2.55 ml) was then added in. The reactant solution was further degassed by Ar bubbling for 15 min before it was heated in a microwave reaction chamber at 100° C. for 1 min, and 150° C. for 19 mins. After the vial was cooled to temperature, the mixture was precipitated in hexane and polymer was obtained by filtering through a 0.45 μm nylon filter. The neutral polymer F3NMe2-BT was washed with deionized water.

To a clear 22 ml vial, the neutral polymer (110 mg, 0.2347 mmol) in methanol (15 ml) and add methyl iodide (1.46 ml, 23.47 mmol). The mixture was stirred at 40° C. for 2 hours before cooling to room temperature. Methanol and methyl iodide were removed from the reaction mixture via rotary evaporation. Crude cationic polymer counterbalanced by iodide, was dissolved in minimal amount of DMSO and precipitated in toluene (120 mg, 80.6%) to yield F3-NMe3I-BT. In a clear 22 ml vial, F3-NMe3I-BT (120 mg, 0.1892 mmol) was dissolved in DMSO (7 ml). F3NMe3I-BT was further ion exchanged to F3NMe3OTf-BT as in Example 1 b. The structure of the title is confirmed by 1H NMR and X-ray photoemission spectroscopy.

Figure 1G:
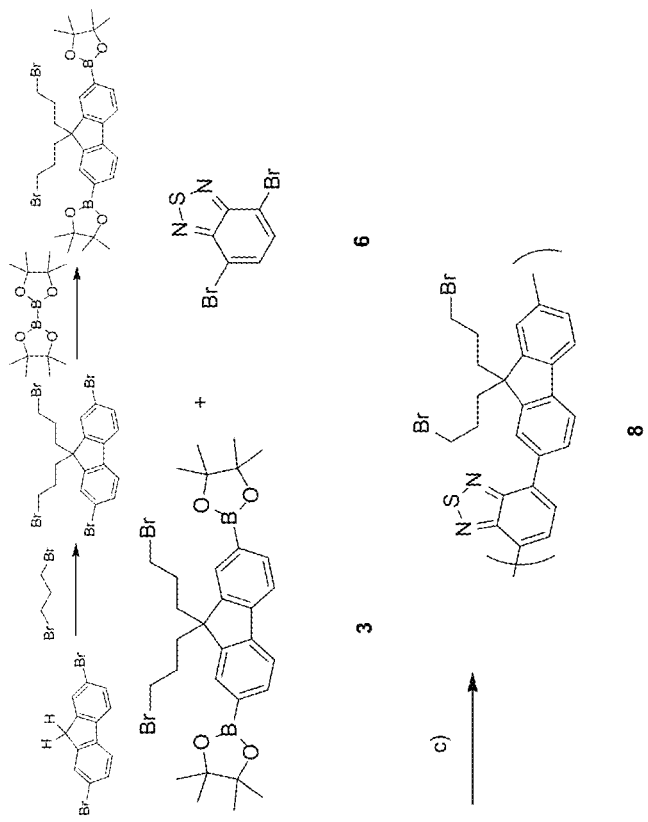

Example 1g—Synthesis of BTF3Br (FIG. 1g)

diEs-F3Br (1 eq) and diBr-BT (1 eq) were added into a argon-charged round bottom flask attached with a reflux condenser. Freshly distilled and degassed dry toluene was added into the reaction mixture. The reaction mixture was allowed refluxed at 125 deg C. to dissolve the monomers. Tetrakis(triphenylphosphine)palladium(0) (2 mol %, Sigma Aldrich) was dissolved into 10 ml of freshly distilled and degassed dry toluene in an argon-charged round bottom flask before added into the reaction mixture. Finally 1M aqueous sodium carbonate (20 eq) together with phase transfer agent aliquot 336 (3 drops) were added into the reaction mixture. The reaction was allowed to reflux at 125 deg C. for 10 h. After 20 h, the reaction mixture was cooled down to room temperature. The reaction mixture was filtered to remove insoluble particles and excess sodium carbonate that is present in the system. The organic phase was separated from the aqueous phase and was subsequently precipitated into excess hexane (5 times volume of toluene). While precipitating the polymer, hexane was stirred continuously to aid precipitation. The polymer suspended in hexane was filtered through 0.2 μm PTFE filter. An orange coloured polymer was obtained after filtration. This polymer was re-dissolved into 4 ml of chloroform to obtain a yellow solution. Re-precipitation was performed with hexane to give an orange-yellow polymer. The mixture was centrifuged and the solvent was removed. This process was repeated another twice to obtained a wet orange-yellow polymer. The polymer was subsequently dried overnight under reduced pressure to give the title polymer.

Figure 1H:
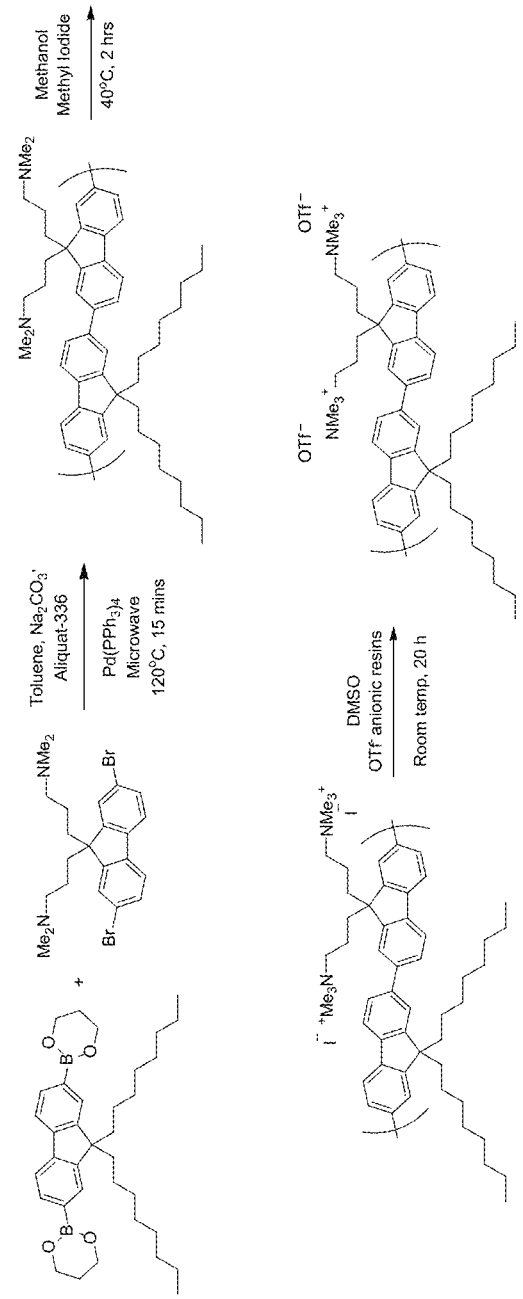

Example 1h—Synthesis of F3NMe3OTf-F8 (FIG. 1h)

To a 20-ml microwave vial, equimolar amounts of F3NMe2-diBr (300.00 mg, 0.607 mmol), F8-diEs (338.90 mg, 0.607 mmol) and Pd(PPh3)4 (2 mol %, 14.03 mg, 0.0121 mmol) were added. The vial was crimp sealed, pump down to vacuum and backfilled with Argon thrice. Degassed toluene (15 ml), with dissolved Aliquat-336 (0.15 ml), was added into the vial to dissolve the monomers. Na$_2$CO$_3$ solution in deionized water (10 equiv, 2M, 3.03 ml) was then added in. The reactant solution was further degassed by Ar bubbling for 15 min before it was heated in a microwave reaction chamber at 100° C. for 1 min, and 120° C. for 14 mins. After the vial was cooled to temperature, the mixture was precipitated in methanol and polymer was obtained by filtering through a 0.45 μm nylon filter. The neutral polymer F3NMe2-F8 was washed with deionized water and acetone. To a clear 22 ml vial, the neutral polymer (200 mg, 0.2347 mmol) in methanol (40 ml) and add methyl iodide (1.46 ml, 23.47 mmol). The mixture was stirred at 40° C. for 2 hours before cooling to room temperature. Methanol and methyl iodide were removed from the reaction mixture via rotary evaporation. Crude cationic polymer counterbalanced by iodide, was dissolved in minimal amount of DMSO and precipitated in toluene. Polymer solids collected were stirred vigorously with saturated sodium diethyldithiocarbamate solution (20 h) to remove Pd catalyst residues. They were recovered by filtration after the wash and finally ion-exchanged to trifate (OTf$^-$) form by Amberlyst A26 OTf$^-$ resins. The structure of the title is confirmed by 1H NMR and X-ray photoemission spectroscopy.

Example 2—Doping of Polymer

Examples are outlined below for the solution-state doping and film-state post-doping of different n-dopable polymers to give self-compensated n-doped films with ultralow workfunction and illustrate the generality of the concept.

Example 2a—Film-State Post-Doping of NDIC3NMe3I-TT with Sodium Diphenylanthracenide NDIC3NMe3I-TT polymer (10.0 mg, 11.6 µmols) and dimethyl sulfoxide (259 µL) were mixed to obtain a bluish-purple 38.6 mg/mL solution. This solution was spin-cast at 2000 rev per min to give a film of thickness 20-25 nm, which was baked on a hotplate (140° C., 15 min) in a nitrogen ($N_2$)-filled glovebox to remove residual solvent including water.

9,10-Diphenylanthrance (DPA) (104.38 mg, weighed in air) was mixed with anhydrous diethylene glycol dimethyl ether (21 mL) to give a solution of 15 mM in $N_2$ glove box. 14 mL of 15 mM DPA solution was added to 144 mg of sodium mercury amalgam (Na 5%). 95.4 uL of mercury was added to the mixture. Clear DPA solution turned dark blue, indicative of the formation of NaDPA n-dopant. 200 uL dark blue 15 mM NaDPA solution was diluted with 1 mL of anhydrous diethylene glycol dimethyl ether to yield a n-dopant solution of 2.5 mM.

Step 1: Film-State n-Doping

The 2.5 mM NaDPA in anhydrous diethylene glycol dimethyl ether (80 µL per square cm of film) was contacted with the polymer film (30 s) and spun off at 6,000 rev per min, in the $N_2$ glovebox. The polymer film turned from bluish-purple to brown.

Step 2: Excess Ion Removal

Figure 2:
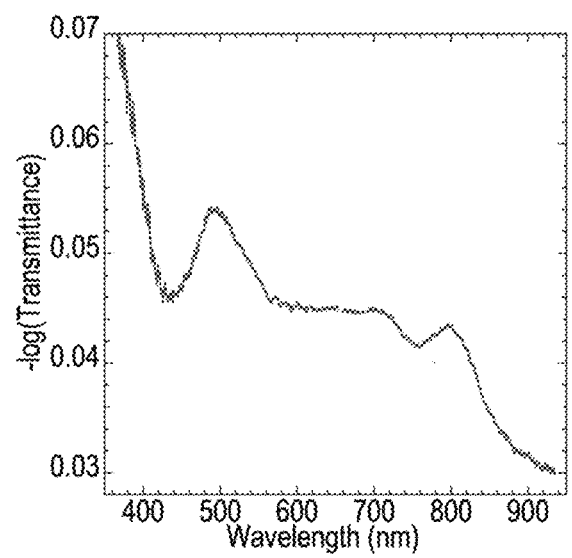
FIG. 2 shows UV-Vis spectra of n-doped polymer NDIC3NMe3I-TT.

Anhydrous diethylene glycol dimethyl ether (80 µL per square cm of film) was contacted with the polymer film (10 s) and spun off at 6000 rev per min, in the $N_2$ glovebox. UV-Vis spectroscopy indicated a doping density of 1.0 electrons per repeat unit of polymer (FIG. 2). X-ray photoemission spectroscopy indicated the sodium, iodide and DPA impurities were satisfactorily removed. These results confirmed the self-compensated n-doped state was achieved. Ultraviolet photoemission spectroscopy indicated a workfunction of 4.3 eV.

Example 2b—Film-State Post-Doping of NDIC3NMe3OTf-TT with Cobaltocene

NDIC3NMe3OTf-TT polymer (10 mg, 11.07 µmols) and DMSO (0369 µL) were mixed to obtain a bluish-purple 30 mM solution. This solution was spin-cast at 2000 rev per min to give a film of thickness 20-25 nm, which was baked on a hotplate (140° C., 15 min) in a nitrogen ($N_2$)-filled glovebox to remove residual solvent including water.

CoCp2 (2 mg, 10.58 µmols, weighed in $N_2$) was mixed with diglyme (7.05 mL) to give a solution of 1.5 mM of the n-dopant solution in $N_2$ glove box.

Step 1: Film-State n-Doping.

As in Example 2a except replacement of NaDPA with cobaltocene dopant

Step 2: Excess Ion Removal.

As in Example 2a

Example 2c—Film-State Post-Doping of DPPT2C3NMe3OTf-TT with Decamethylcobaltocene DPPT2C3NMe3OTf-TT polymer (10 mg, 10.67 µmols) and DMSO (333 µL) were mixed to obtain a dark blue solution of 30 mg/mL. This solution was spin-cast at 2000 rev per min to give a film of thickness 20-25 nm, which was baked on a hotplate (140° C., 15 min) in a nitrogen ($N_2$)-filled glovebox to remove residual solvent including water.

CoCp*2 (2 mg, 6.07 µmols, weighed in $N_2$) was mixed with diglyme (12 mL) to give a solution of 0.5 mM of the n-dopant solution in $N_2$ glove box.

Step 1: Film-State n-Doping.

The CoCp*2 n-dopant solution (80 µL per square cm of film) was contacted with the polymer film (30 s) and spun off at 6,000 rev per min, in the $N_2$ glovebox. The polymer film turned from blue to brown.

Step 2: Excess Ion Removal.

Anhydrous diglyme (80 µL per square cm of film) was contacted with the polymer film (10 s) and spun off at 6000 rev per min, in the $N_2$ glovebox.

Example 2d—Film-State Post-Doping of F3NMe3BrBT with Sodium Benzophenone Ketyl

F3NMe3BrBT polymer (10 mg, 151.38 µmols) and MeOH (1 mL) were mixed to obtain a yellow-orange 10 mg/mL solution. This solution was spin-cast at 2000 rev per min to give a film of thickness 20-25 nm.

Benzophenone ($Ph_2CO$) (40.0 mg, weighed in air) was mixed with anhydrous diethylene glycol dimethyl ether (14.6 mL) to give a solution of 15 mM in $N_2$ glove box. 12.2 mL of 15 mM $Ph_2CO$ solution was added to 56.2 mg of sodium mercury amalgam (Na 5%). 37.2 uL of mercury was added to the mixture. Clear $Ph_2C0$ solution turned dark blue, indicative of the formation of $NaPh_2CO$ n-dopant. 200 uL dark blue 15 mM $NaPh_2C0$ solution was diluted with 1 mL of anhydrous diethylene glycol dimethyl ether to yield a n-dopant solution of 2.5 mM.

Step 1: Film-State n-Doping

As in Example 2a except replacement of dopant with $NaPh_2CO$. The polymer film turned from pale yellow to blue.

Step 2: Excess Ion Removal

Anhydrous diglyme (80 µL per square cm of film) was contacted with the polymer film (30 s) and spun off at 6000 rev per min, in the $N_2$ glovebox. X-ray photoemission spectroscopy indicated the sodium oxide by-product was satisfactorily removed. These results confirmed the self-compensated n-doped state was achieved. Ultraviolet photoemission spectroscopy indicated a workfunction of 3.5 eV.

Example 2e—Solution-State Doping of NDIC3NMe3OTf-TT with NaDPA

NDIC3NMe3OTf-TT polymer (5.35 mg, 5.93 µmols) and anhydrous dimethyl sulfoxide (356 µL) were mixed to obtain a bluish-purple 15 mg/mL solution. A 30 mM NaDPA solution was prepared in diethylene glycol dimethyl ether as described in Example 2a. The NaDPA solution was added gradually to the polymer solution (1.0 equiv) to give a dark brown solution. The crude n-doped polymer product was precipitated with anhydrous diethylene glycol dimethyl ether (5 vol), and recovered on centrifuge at 6,000 rev per min (3100 g, 5 min). The precipitate was then dissolved in anhydrous dimethyl sulfoxide to give a dark brown solution (30 mM, by repeat unit). UV-Vis spectroscopy indicated a doping density of 1.0 electrons per repeat unit of polymer.

Example 2f—Solution-State Doping of NDIC3NMe3OTf-TT with Cobaltocene

NDIC3NMe3OTf-TT polymer (14.4 mg, 15.9 μmols) and anhydrous dimethyl sulfoxide (500 μL) were mixed to obtain a bluish-purple 10 mg/mL solution. A 100 mM CoCp2 solution was prepared in diethylene glycol dimethyl ether as described in Example 2b. The cobaltocene solution was added gradually to the polymer solution (1.0 equiv) to give a dark brown solution. The crude n-doped polymer product was precipitated with anhydrous diethylene glycol dimethyl ether (5 vol), and recovered on centrifuge at 6,000 rev per min (3100 g, 5 min). The precipitate was then dissolved in anhydrous dimethyl sulfoxide to give a dark brown solution (30 mM, by repeat unit).

UV-Vis spectroscopy indicated a doping density of 1.0 electrons per repeat unit of polymer. Infrared spectroscopy indicated the triflate and cobaltacene and cobaltocenium impurities were satisfactorily removed. These results confirmed the self-compensated n-doped state was achieved.

Example 2g—Solution-State Doping of NDIC3NMe3OTf-TT with NaDPA Giving a Self-Assembled n-Doped Monolayer NDIC3NMe3OTf-TT polymer (5.35 mg, 5.93 μmols) and anhydrous dimethyl sulfoxide (356 μL) were mixed to obtain a bluish-purple 15 mg/mL solution. A 15 mM NaDPA solution was prepared in diethylene glycol dimethyl ether as described in Example 2a. The NaDPA solution was added gradually to the polymer solution (1.5 equiv) to give a dark brown solution. The crude n-doped polymer product was precipitated with anhydrous diethylene glycol dimethyl ether (5 vol), and recovered on centrifuge at 6,000 rev per min (3100 g, 5 min). The precipitate was then dissolved in anhydrous dimethyl sulfoxide to obtain a 10 mg/ml self-compensated n-doped solution. A self-aligned layer of n-doped NDIC3NMe3OTf-TT on the s-d electrode was self-assembled onto the Au or Ag s-d electrode by contacting a 10 mg/ml solution of n-doped NDIC3NMe3OTf-TT in DMSO for 1 min, followed by flood-wash with clean DMSO and spin-dry.

Example 3—Improved Device Performances

Examples are outlined below to illustrate the improvements in electron-injection and electron-extraction performance.

Example 3a—Electron Injection from Deep Workfunction Ag Through n-Doped EIL

Poly(3,4-ethylenedioxythiophene):Polystyrene sulfonic acid (1:6) (PEDT:PSSH) polymer films were spun in air on O2-plasma-cleaned ITO substrates and annealed (140° C., 15 min) in N$_2$ glovebox. Host material DPPT2-TT from chlorobenzene was then spin-cast over the PEDT:PSSH film. Self-compensated n-doped NDIC3NMe3OTf-TT film described in Example 2f was spin-cast on DPPT2-TT. Devices were completed with the evaporation of Ag.

Figure 3:
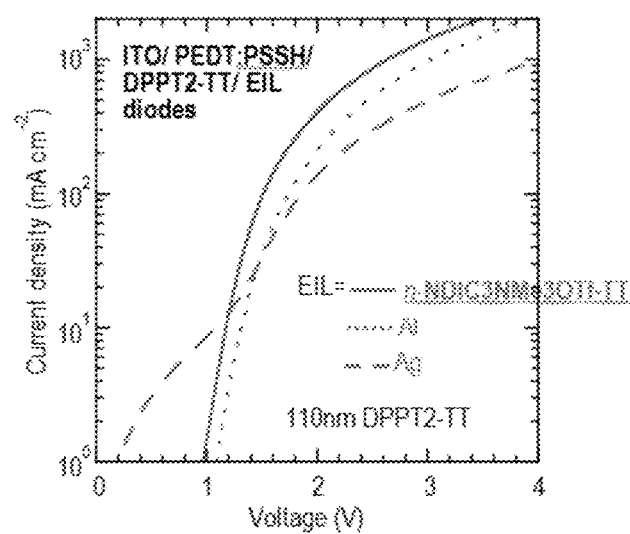
FIG. 3 shows JV curves of bipolar diodes showing ohmic electron injection into poly{2,5-bis(2-octyldodecyl)-3-(5-(thieno[3,2-b]thiophen-2,5-yl)thiophen-2-yl)-6-(thiophen-2,5-yl)pyrrolo[3,4-c]pyrrole-1,4(2H,5H)-dione} (DPPT2-TT) using n-doped polymer NDIC3NMe3I-TT as EIL.

The reference device without the n-doped NDIC3NMe3OTf-TT as the EIL gave an injection current density of 0.1 Acm$^{-2}$ at 8V. The self-compensated n-doped NDIC3NMe3OTf-TT give an order of magnitude of electron current density higher than the reference similar to another device completed with the evaporation of Al, an ohmic injector into DPPT2-TT. (FIG. 3)

Example 3b—Electron Injection from ITO Through n-Doped EIL

Self-compensated n-doped NDIC3NMe3I-TT and NDIC3NMe3OTf-TT polymer films described above in Example 2f were spin-cast on 02-plasma cleaned ITO substrates in N2 glovebox. Host material PNDI(2OD)-T2 from chlorobenzene was then spin-cast over the film. Devices were completed with the evaporation of 30-nm Pd and 120-nm Ag.

Figure 4:
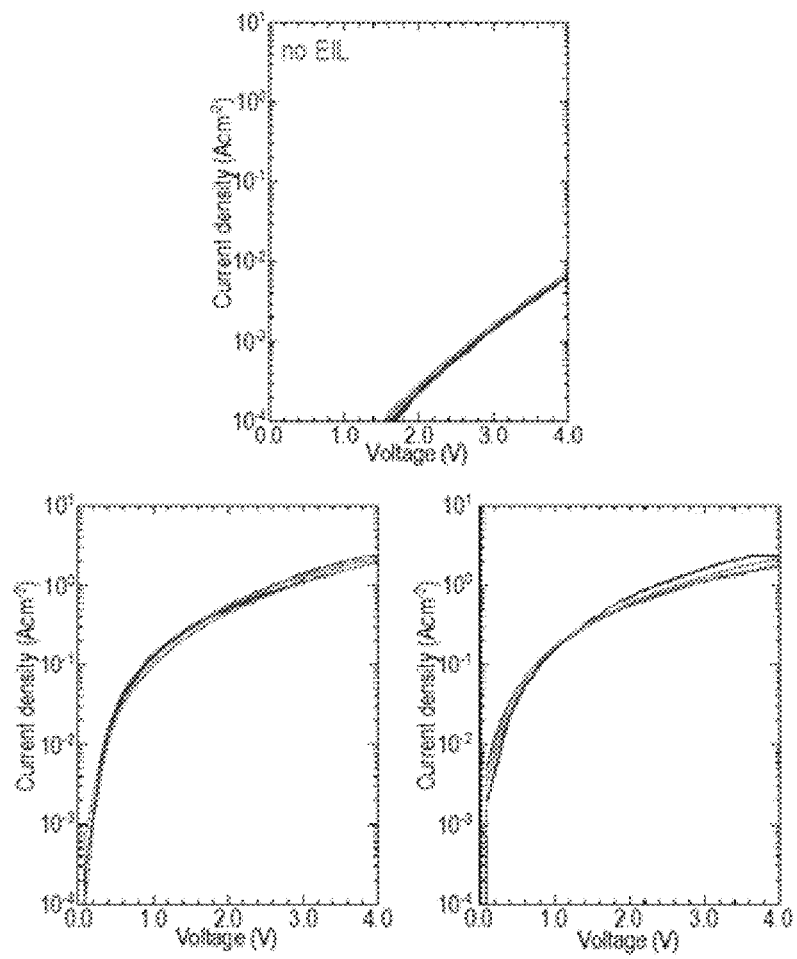
FIG. 4 shows JV curves of bipolar diodes showing ohmic electron injection into poly{[N,N'-bis(2-octyldodecyl)-naphthalene-1,4,5,8-bis(dicarboximide)-2,6-diyl]-alt-[5,5'-(2,2'-bithiophene) PNDI(2OD)-T2 using n-doped polymer NDIC3NMe3I-TT as EIL.

The reference device without the n-doped EIL gave an injection current density of 10$^{-2}$ Acm$^{-2}$ at 4V. The self-compensated n-doped NDIC3NMe3I-TT and NDIC3NMe3OTf-TT give 2 orders of magnitude of electron current density higher than the reference. (FIG. 4)

Example 3c—Electron Injection from Deep Workfunction Ag Through n-Doped EIL

PEDT:PSSH (1:6) polymer films were spun in air on SC1-cleaned ITO substrates and annealed (140° C., 15 min) in N$_2$ glovebox. 120-nm-thick host material PFOP from toluene was then spin-cast over the PEDT:PSSH film. 20-nm-thick F3NMe3BrBT film was spin-cast on PFOP and n-doped as described in Example 2d. Devices were completed with the evaporation of Ag.

Figure 5:
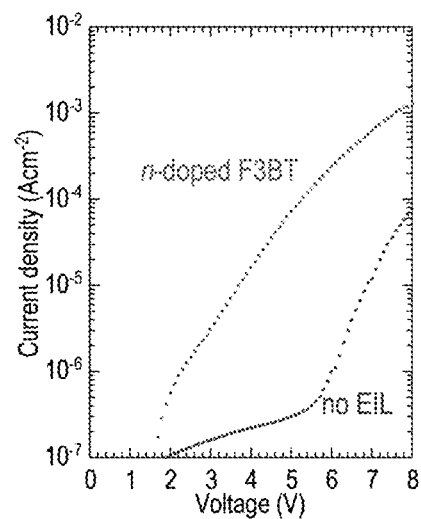
FIG. 5 shows JV curves of bipolar diodes showing near ohmic electron injection into poly(9,9-bis(p-octylphenyl) fluorene) (PFOP) using n-doped polymer BT-F3NMe3OTf as EIL.

The reference device without the n-doped F3NMe3BrBT as the EIL gave an injection current density of 10$^{-4}$ Acm$^{-2}$ at 8V. The self-compensated n-doped F3NMe3BrBT give an order of magnitude of electron current density higher than the reference. (FIG. 5)

Example 3d—Electron Injection from ITO Through n-Doped EIL

Figure 6:
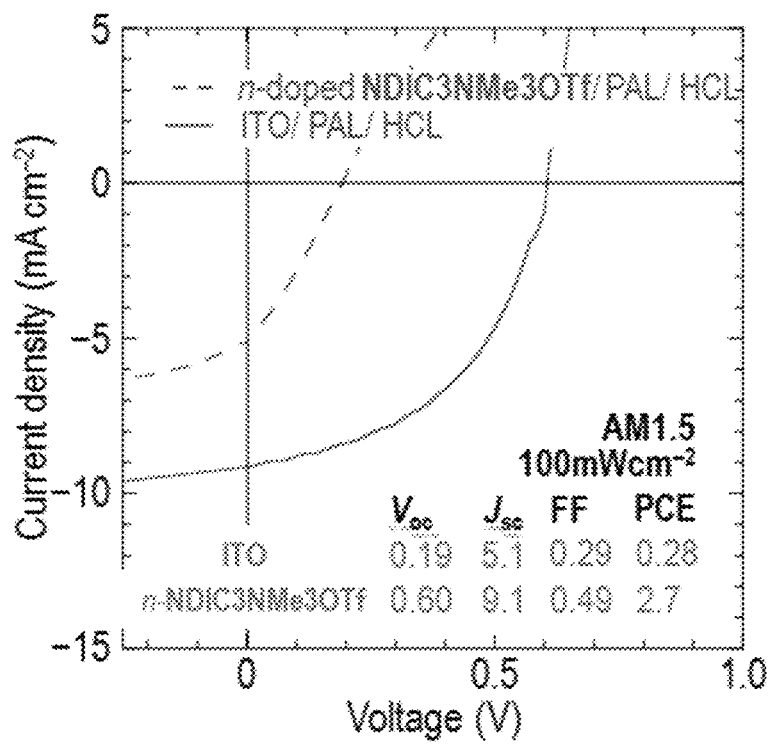
FIG. 6 shows JV curves of organic solar cells showing efficient electron collection from P3HT: PCBM using n-doped polymer NDIC3NMe3I-TT as EEL.

Self-compensated n-doped NDIC3NMe3OTf-TT polymer films described above in Example 2f were spin-cast on 02-plasma cleaned ITO substrates in N2 glovebox. Host material P3HT:PCBM (1:0.8 w/w) from chlorobenzene was then spin-cast over the film. PEDT:PSSH modified with 5 mol % hexadecyltrimethylammonium bromide was spin-cast over the active layer. Devices were completed with the evaporation of 120-nm Ag. The reference device without the n-doped EIL gave a low short circuit current (Jsc) of 5 mAcm$^{-2}$ and a low open circuit voltage (Voc) of 0.18 V. The device with the self-compensated n-doped NDIC3NMe3OTf-TT give significantly higher Jsc and Voc of 9 mAcm$^{-2}$ and 0.59 V respectively. (FIG. 6)

Figure 7:
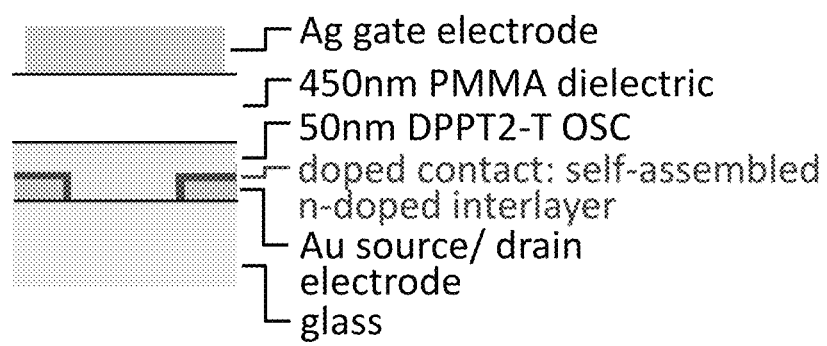
FIG. 7 shows IV curves of field effect transistors (FETs) incorporated with self-assembled n-doped NDIC3NMe3I-TT on Au source drain electrodes, and also on Ag source drain electrodes demonstrating the conversion of ambipolar FET to n-type FETs.
Figure 7:
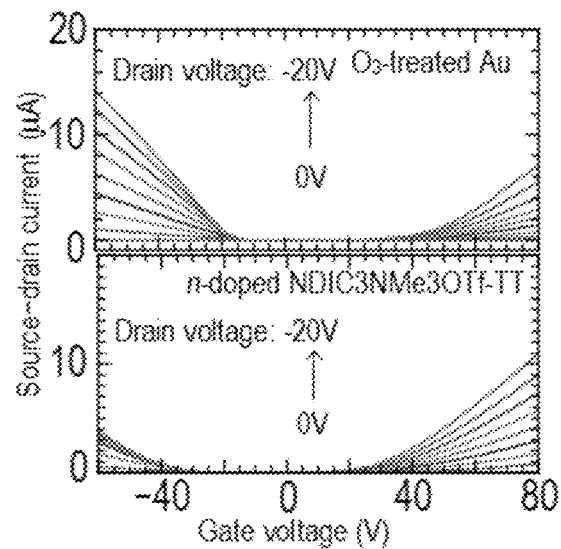
Figure 7:
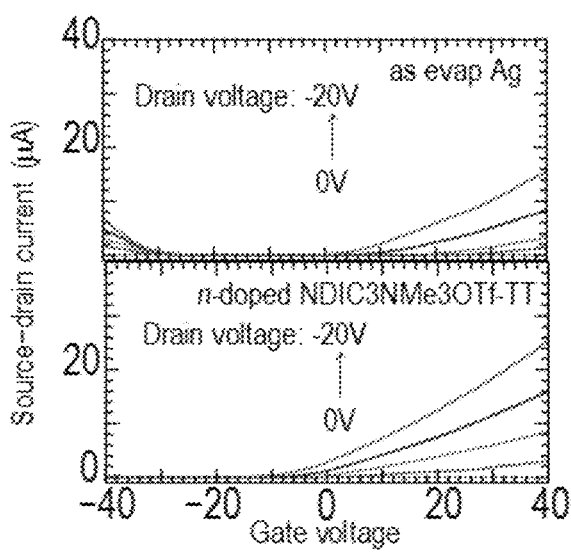

Example 3e—n-Type Top-Gate Bottom-Contact Organic Field Effect Transistors 50-m,-thick Au source-drain (s-d) electrodes were deposited through a shadow mask on a glass substrate to provide a channel length of 100 µm and a channel width of 3 nm. For the prior art device, the substrate was cleaned by UV-ozone. For the device with a monolayer of self-compensated n-doped EIL, a monolayer of self-compensated n-doped NDIC3NMe3OTf-TT polymer is self-assembled onto Au s-d. 50-nm-thick poly{2,5-bis(2-octyldodecyl)-3-(5-(thiophen-2,5-yl)thiophen-2-yl)-6-(thiophen-2,5-yl)pyrrolo[3,4-c]pyrrole-1,4(2H,5H)-dione} (DPPT2-T) films from chlorobenzene solution were spin-cast over the s-d electrodes in the glovebox. The films were annealed at 100° C. (hotplate) for 3 min in glovebox. Poly(methyl methacrylate) (PMMA, Sigma Aldrich; Mw 2M) in butyl acetate was spin-cast over the OSC to give 450-nm-thick gate dielectric. The films were annealed at 90° C. (hotplate) for 3 min in glovebox. 50-nm of Ag was evaporated through a shadow mask as the gate electrode (see FIG. 7 for device configuration).

Figure 8:
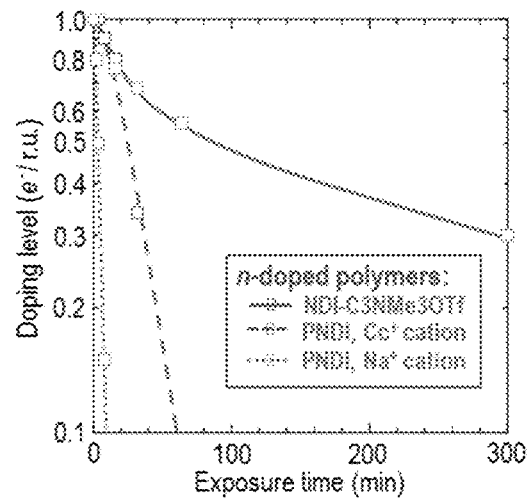
FIG. 8 shows enhanced stability of n-doped self-compensated NDIC3NMe3I-TT.
Figure 8:
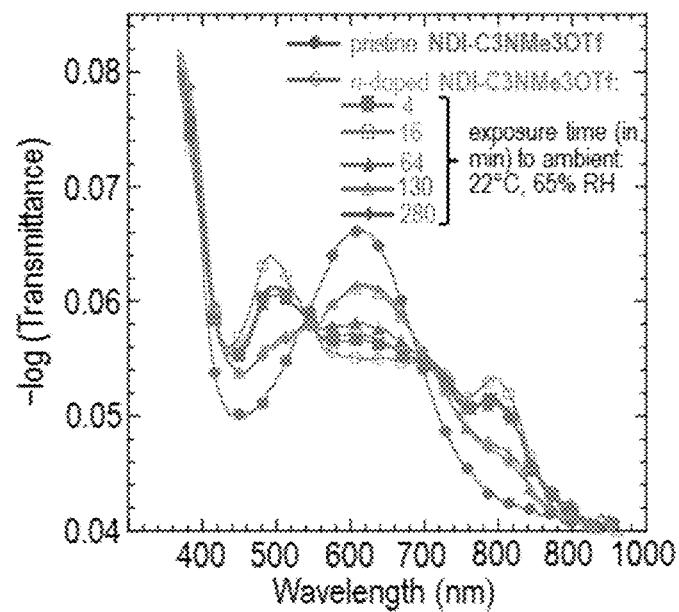

The FET with Au electrodes gives expected ambipolar behaviour with weak asymmetry. When the EIL is inserted, the p-channel characteristics are suppressed by a 15-V downshift of their $V_{gs}$ threshold and a reduction of hole current. A similar effect is observed when Au s-d electrodes are replaced by Ag. As a consequence, ambipolar FETs can be differentiated into n-channel FETs. (see FIG. 8).

Example 4—Improved Ambient Stability of n-Doped Polymer Films

PNDI(2OD)-T2 was dissolved in THF to give a 10 mg/ml solution. 2.0 equiv of cobaltocene (in THF) was added dropwise to dope the polymer. The electrons on the polymer backbone of n-doped PNDI(2OD)-T2 is counterbalanced by cobaltocenium cation. Using another dopant, NaDPA, PNDI (2OD)-T2 was spun from THF solution to give 40-nm-thick films on $O_2$-plasma cleaned glass substrates. The films were annealed at 140° C. (hotplate) for 15 min in $N_2$ prior to contacting with 1.8 mM NaDPA in diglyme for 10 s before dopant was spun off at high speed. Excess ions and impuries were removed by ACN spin-wash steps. The electrons on the polymer backbone of n-doped PNDI(2OD)-T2 is thus counterbalaneced by sodium cation. Self-compensated n-doped NDIC3NMe3OTf-TT film described in Example 2b was prepared on $O_2$-plasma cleaned glass substrates. Here, the counter-cation is immobilised. These doped films were subsequently exposed to ambient (22° C.; 65% RH; dark) and their UV-Vis spectra were collected at different time intervals.

The self-compensated n-doped NDIC3NMe3OTf-TT film showed much better stability (Time-to-50%-d.I. ~2 h) compared to the other two n-doped films with mobile sodium or cobaltocenium.

Example 5—Film-State Doping of NDIC3NMe3OTf-T2 and PNDI(2OD)-T2 with 1,3-dimethyl-2-(p-dimethylamino)phenyl-2,3-dihydrobenzoimidazole (DMBI)

Undoped NDIC3NMe3OTf-T2 was dissolved in DMSO to give a 40 mg/mL solution. 2 eq of DMBI (100 mM in DMSO) was added dropwise to the polymer solution. 15-nm-thick films were spin-cast with and without DMBI and further annealed at 120° C. (hotplate; N2 glovebox) for 10 min.

Undoped PNDI(2OD)-T2 was dissolved in CHCl3 to give a 5 mg/ml solution. 2 eq of DMBI (50 mM in CHCl3) was added dropwise to the polymer solution. 20-nm-thick films with and without DMBI were spin-cast and further annealed at 120° C. (hotplate; N2 glovebox) for 10 min.

Figure 9:
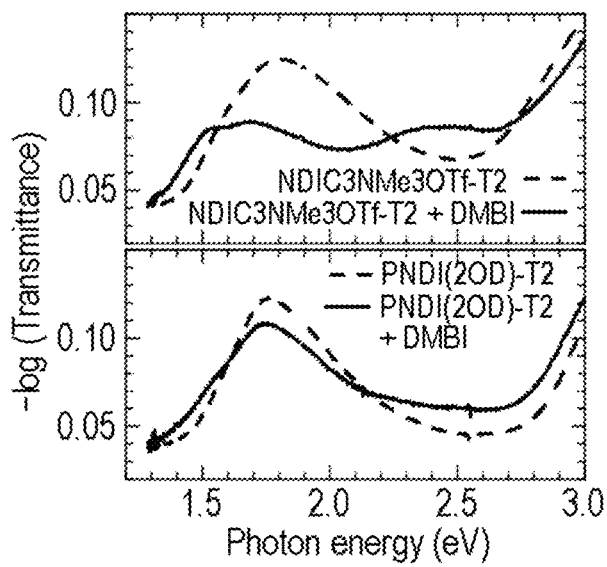
FIG. 9 shows the use of precursor n-dopant (DMBI) to n-dope NDIC3NMe3OTf-T2 films.

FIG. 9 shows UV-Vis spectra of undoped NDIC3NMe3OTf-T2 and NDIC3NMe3OTf-T2 doped by DMBI (annealed to 120° C.) has a higher doping level due to its tethered counter-ions that promote and stabilize n-doping with precursor dopants, as compared to PNDI(2OD)-T2, which has the same p-conjugated semiconducting core as NDIC3NMe3OTf-T2 but lacks tethered counter-ions, shows a considerably lower extent of n-doping under identical conditions due to lower stability of its n-doped state.

Example 6—Model Blue-Emitting Diode with n-Doped F3NMe3OTf-F8 as EIL

Undoped F3NMe3OTf-F8 was dissolved in ACN to give a 5 mg/mL solution. The solution was added to 3 eq of Na—Hg amalgam (5 wt % Na). Hg was added to the solution to dilute the concentration of Na—Hg to 0.05 wt % such that the alloy is liquefied. The solution turns from colourless to purplish-red after doping.

30-nm-thick doped film of pTFF-F3TFSINa (WF=5.7 eV) was deposited on $O_2$-plasma cleaned ITO substrates. PFOP was spin-cast from toluene solution over the HILs in the glovebox to give 90 nm-thick films. The n-doped F3NMe3OTf-F8 solution was filtered through a 0.2-mm polypropylene filter before spin-cast over the PFOP film to give 20-nm-thick film followed by 150-nm-thick Al.

45-nm-thick PEDT:PSSH films were deposited on $O_2$-plasma cleaned ITO substrates following the standard procedure above. PFOP was spin-cast from toluene solution over the HILs in the glovebox to give 90 nm-thick films followed by 30-nm-thick Ca capped with 150-nm-thick Al to give the control device.

Figure 10:
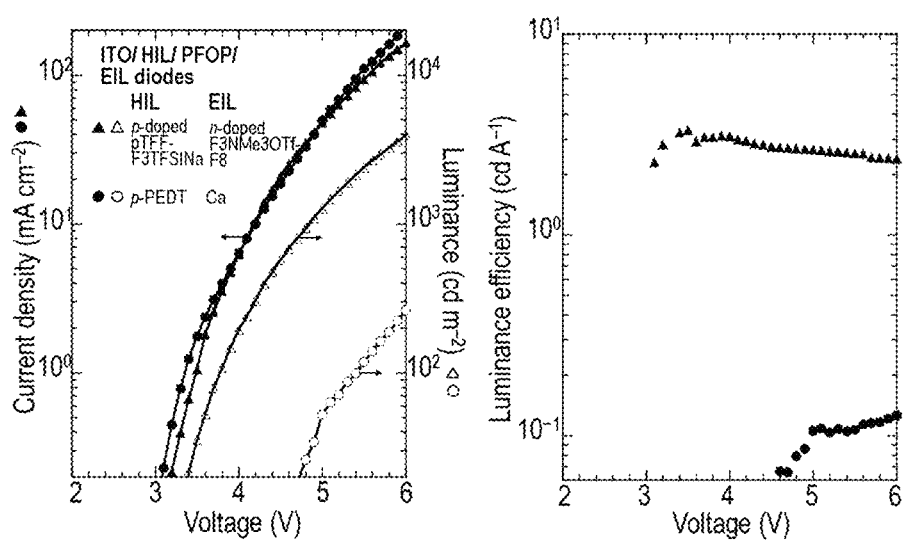
FIG. 10 shows the JVL and electroluminescence efficiency plots for an efficient model blue-emitting diode with n-doped F3NMe3OTf-F8 as EIL.

FIG. 10 (left) shows the diode with the solution-processed HIL and EIL gives a higher current density when the JV characteristics are aligned to V-Vbi. FIG. 10 (right) shows this diode also exhibits a considerably more balanced electron-hole injection, as evidenced by its one-and-a-half orders of magnitude improvement in electroluminescence efficiency (2-3 cd $A^{-1}$) over the control diode (0.1 cd $A^{-1}$) which is electron-dominated.

The invention claimed is:
1. A material comprising:
   a n-doped electrically conductive polymer comprising at least one electron-deficient aromatic moiety, each electron-deficient aromatic moiety having a gas-phase electron affinity ($E_A$) of 1-3 eV; and
   at least one counter-cation covalently bonded to the polymer or to a further polymer comprised in the material,
   wherein the polymer is n-doped to a charge density of 0.1-1 electron per electron-deficient aromatic moiety, the polymer is capable of forming a layer having a vacuum workfunction (WF) of 2.5-4.5 eV, and wherein all the counter-cations comprised in the material are immobilised such that any electron in the polymer cannot significantly diffuse or migrate out of the polymer.

2. The material according to claim 1, wherein the electron-deficient aromatic moiety is: a functionalized polycyclic aromatic motif, monoannulated benzo motif, bisannulated benzo motif, monoannulated naphtho motif, bisannulated naphtho motif, monoannulated heterocylic motif, pyridine motif, benzene motif, pyrylium motif, or a combination thereof.

3. The material according to claim 2, wherein the electron-deficient aromatic moiety is substituted or unsubstituted: benzothiadiazole, benzobisthiadiazole, benzooxadiazole, benzobisoxadiazole, benzimidazole, indazole, benzotriazole peryleneteracarboxydiimide, napthalenetetracarboxidimide, diketopyrrolopyrrole, thienopyrrole, thiadiazoloquinoxaline, napthothiadiazole, napthobisthiadiazole, indenofluorene, 2,5-difluorobenzene, fluorene, or a combination thereof.

4. The material according to claim 1, wherein the polymer optionally comprises at least one co-moiety selected from the group consisting of: substituted or unsubstituted: fluorene, phenylene, arylene vinylene, thiophene, azole, quinoxaline, thienothiophene, arylamine, bisphenol-A, methacrylate, siloxane, meta-linked benzene, and a combination thereof.

5. The material according to claim 1, wherein at least one H on an aromatic ring of the electron-deficient aromatic moiety is substituted with a group consisting of: alkyl, cycloalkyl, phenyl, substituted phenyl, substituted heterocyclic, alkoxy, phenoxy, substituted phenoxy, alkylthio, phenylthio, substituted phenylthio, fluorine, cyano, nitro, alkylketo, trichloromethyl, and trifluoromethyl.

6. The material according to claim 1, wherein the counter-cation is selected from the group consisting of: substituted or unsubstituted ammonium, morpholinium, piperidinium, pyrrolidinium, sulfonium, phosphonium, pyridinium, imidazolium, pyrrolium and pyrylium.

7. The material according to claim 1, wherein the material comprises:
poly(2,5-bis(3-trimethylammoniopropyl-3-(5-(thieno[3,2-b]thiophen-2,5-yl)thiophen-2-yl)-6-(thiophen-2,5-yl) pyrrolo[3,4-c]pyrrole-1,4(2H,5H)-dione) triflate] (DPPT2C3NMe3OTf-TT);
poly{[N,N'-bis(3-trimethylammoniopropyl)-naphthalene-1,4,5,8-bis(dicarboximide)-2,6-diyl]-alt-[2,5-(thieno[3,2-b]thiophene)]iodide} (NDIC3NMe3I-TT);
poly{[N,N'-bis(3-trimethylammoniopropyl)-naphthalene-1,4,5,8-bis(dicarboximide)-2,6-diyl]-alt-[2,5-(thieno[3,2-b]thiophene)]triflate} (NDIC3NMe3 OTf-TT);
poly{[N,N'-bis(3-(4-methylmorpholino)propyl)-naphthalene-1,4,5,8-bis(dicarboximide)-2,6-diyl]-alt-[2,5-(thieno[3,2-b]thiophene)]triflate} (NDIC3MorOTf-TT);
poly{[N,N'-bis(3-trimethylammoniopropyl)-naphthalene-1,4,5,8-bis(dicarboximide)-2,6-diyl]-alt-[5,5'-(2,2'-bithiophene) triflate}, (NDIC3NMe3 OTf-T2);
poly{[9,9'-bis(3-trimethylammoniopropyl)fluorenyl-2,7-diyl]-alt-(benzo[2,1,3]thiadiazole-4,8-diyl) triflate} (BT-F3NMe3OTf); or
poly{[9,9'-bis(3-trimethylammoniopropyl)fluorenyl-2,7-diyl]-alt-(9,9'-dioctylfluorenyl-2,7-diyl)} (F3NMe3OTf-F8).

8. A composition comprising the material according to claim 1 and a polymer diluent.

9. A method of preparing the material according to claim 1 comprising:
preparing a mixture comprising a polymer and at least one counter-cation covalently bonded to the polymer or to a further polymer, the polymer comprising:
at least one electron-deficient aromatic moiety, each electron-deficient aromatic moiety having a gas-phase electron affinity ($E_A$) of 1-3 eV;
doping the polymer with a n-dopant to form a n-doped polymer, wherein the n-dopant is a reductant with a formal reduction potential smaller than about −1.3 V versus a Standard Hydrogen Electrode; and
removing excess mobile counter-cations to form the material.

10. The method according to claim 9, wherein the n-dopant is selected from the group consisting of: sodium, sodium napthalenide, sodium benzophenone keyl, sodium 9,10-diphenylanthracenide, cobaltocene and decamethylcobaltocene, or generated from a precursor n-dopant by light or heat activation, and selected from the group consisting of derivatives of: 2-phenyl-1,3-dialkyl-2,3-dihydrobenzimidazole, 2-phenyl-1,2,3-trialkyl-2,3-dihydrobenzimidazole and 1,2,2,3-tetraalkyl-2,3-dihydrobenzimidazole.

11. The method according to claim 9, further comprising depositing a layer of the polymer on a surface of a substrate prior to the doping.

12. The method according to claim 11, further comprising patterning the layer prior to the doping.

13. A layer comprising the material according to claim 1, wherein the layer has a vacuum workfunction (WF) of 2.5-4.5 eV.

14. The layer according to claim 13, wherein the layer is an electron-injection layer or an electron-extraction layer.

15. The layer according to claim 13, wherein the layer forms an ohmic electron-injection or electron-extraction contact to a semiconductor.

16. The layer according to claim 13, wherein the layer has a thickness of 5-100 nm.

17. A device comprising the material according to claim 1.

18. A device comprising a layer according to claim 13.

* * * * *